(12) United States Patent
Nishino et al.

(10) Patent No.: US 8,677,079 B2
(45) Date of Patent: Mar. 18, 2014

(54) SELECTING A POSITION WHERE DATA IS STORED

(75) Inventors: Kiyoshi Nishino, Kanagawa (JP);
Kiyoshi Takemura, Kanagawa (JP);
Nobuyoshi Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 888 days.

(21) Appl. No.: 12/775,113

(22) Filed: May 6, 2010

(65) Prior Publication Data

US 2010/0293344 A1  Nov. 18, 2010

(30) Foreign Application Priority Data

May 13, 2009  (JP) .................. 2009-116851

(51) Int. Cl.
*G06F 12/00* (2006.01)
*G06F 13/00* (2006.01)
*G06F 13/28* (2006.01)

(52) U.S. Cl.
USPC ......................................... 711/154

(58) Field of Classification Search
USPC .......................... 711/154, E12.001
See application file for complete search history.

(56) References Cited

U.S. PATENT DOCUMENTS

| | | | |
|---|---|---|---|
| 5,448,733 A * | 9/1995 | Satoh et al. ............ | 1/1 |
| 5,740,097 A | 4/1998 | Satoh | |
| 5,877,714 A | 3/1999 | Satoh | |
| 6,181,592 B1 | 1/2001 | Aoki | |
| 8,160,372 B1 * | 4/2012 | Alakuijala et al. ............ | 382/232 |
| 2004/0022312 A1 | 2/2004 | Jones et al. | |

FOREIGN PATENT DOCUMENTS

| | | |
|---|---|---|
| JP | 63-244496 | 10/1988 |
| JP | 07-114577 | 5/1995 |
| JP | 08-147986 | 6/1996 |
| JP | 08-242176 | 9/1996 |
| JP | 2000-215678 | 8/2000 |
| JP | 2001-014864 | 1/2001 |
| JP | 2001-184871 | 7/2001 |
| JP | 2003-152548 | 5/2003 |
| JP | 2005-011499 | 1/2005 |
| JP | 2005-535175 | 11/2005 |

* cited by examiner

*Primary Examiner* — Michael Alsip
(74) *Attorney, Agent, or Firm* — The Steadman Law Firm PLLC; Cynthia G. Seal; Katherine S. Brown

(57) ABSTRACT

An apparatus and method are provided for selecting a specific position from a plurality of positions in a memory to which data elements are cyclically written. A specific data element is stored in the plurality of positions. The apparatus comprises a determination unit for determining whether the plurality of positions include any position in a specific area of the memory to which data elements are written in a current cycle. The apparatus further comprises a selection unit for selecting at least one position in the specific area out of the plurality of positions as the specific position if the determination unit determines that the plurality of positions include any position in the specific area, and for selecting at least one position out of the plurality of positions as the specific position if the determination unit determines that the plurality of positions do not include any position in the specific area.

20 Claims, 13 Drawing Sheets

(a)

(b)

(a)

(b)

(c)

(d)

SELECTING A POSITION WHERE DATA IS STORED

RELATED APPLICATION

This application claims priority under 35 U.S.C. §119 to Japanese Patent Application No. 2009-116851 filed May 13, 2009, the entire text of which is specifically incorporated by reference herein.

TECHNICAL FIELD

The various embodiments described herein relate to units and methods for selecting a position where data is stored. In particular, the various embodiments relate to an apparatus and a method for selecting a specific position from a plurality of positions in a memory to which data elements are cyclically written, wherein a specific data element is stored in the plurality of positions.

BACKGROUND

Deflate compression (as defined by the DEFLATE Compressed Data Format Specification RFC 1951) is a compression method that is a base for ZLIB (as defined by the ZLIB Compressed Data Format Specification RFC 1950) and GZIP (as defined by the GZIP File Format Specification RFC 1952), which are data compression formats currently widely used in computers. In deflate compression, data is compressed using the LZ77 code. In the LZ77 code, a repeating portion of a character string in data is searched for, and the data is compressed by replacing the character string with the position and length of the repeating portion. For example, when LZ77-encoding of a character string "IBM is IBM" is performed, the second "IBM" is a repeating portion, and thus this portion is compressed. Specifically, the portion is compressed by being replaced with a code such as "7,3", signifying that "3 character length is repeated from 7 characters ahead". In this case, the longer the character length of a repeating portion is, the higher the compression rate is.

In the specifications of deflate compression, since a search for a repeating portion of a character string is performed for data up to 32 Kbytes ahead of the character string, a significant number of character string comparison operations need to be performed to search for a repeating portion of a character string.

Thus, the operations require significant time when being performed by software. Generally, in software, hashing is used in an attempt to reduce the search time. However, in hashing, when there are many character strings having the same hash value, some of the character strings may be discarded. Thus, a problem exists in that, in view of the processing time and the buffer size, it is difficult to precisely search for all character strings.

Accordingly, methods are provided in the known art for precisely searching all character strings using hardware. Furthermore, in accordance with the methods, a character string can be searched for rapidly.

In Japanese Unexamined Patent Application Publication No. 7-114577, when a character string (BABCABB . . . ) that is stored in content addressable memory cell rows in sequence is searched for a search character string (ABCA), comparison with the first character (A) is performed in all of the cell rows, and comparison with the next character (B) is performed only in respective cell rows at addresses (2) and (5) adjacent to the last matching cell rows. Similarly, comparison with the next character (C) is performed only in respective cell rows at addresses (3) and (6), and comparison with the last character (A) is performed only in a cell row at address (4). In this manner, a search operation is completed in a short period of time.

In Japanese Unexamined Patent Application Publication No. 8-147986, a first switching means is provided on a match line between the opposite side of a switching element to a ground terminal and a power supply, and power consumption is reduced by shortening a period in which a through current flows by turning on the first switching means during a period in which a content addressable memory is turning on or off the switching element in response to a result of comparison or during a period that is a part of a preparation period before the comparison.

In Japanese Unexamined Patent Application Publication No. 8-242176, the results of comparing search characters in a write buffer with character data stored in cell rows in a content addressable memory (CAM) are stored in first and second latches in sequence. When an input signal is low, each signal generation circuit outputs the AND result between the output of the corresponding first latch and the output of a corresponding preceding third latch to a priority encoder and an OR circuit via the corresponding third latch. When the input signal is high, the signal generation circuit outputs the AND result between the output of the first latch and the output of the corresponding preceding second latch to the priority encoder and the OR circuit via the third latch. First and second priority encoders output the respective OR results of input signals. A signal output from the OR circuit is input to each of the signal generation circuits via a corresponding fourth latch and another OR circuit. In this manner, the length of a path through which a signal needs to pass in a clock cycle is reduced by half, thereby improving the processing speed.

The probability is high that a repeating portion of a certain character string will occur in a position relatively close to the character string. Thus, in a method such as deflate compression, the compression rate is improved by assigning a shorter bit length to a repeating portion residing in a position closer to the character string.

Accordingly, in a memory to which data is cyclically written, when a repeating portion of a certain character string is stored in a plurality of positions, it is necessary to select a repeating portion stored in one of the plurality of positions. In such case, the compression rate is improved by selecting a repeating portion close to the character string, considering the order of writing, instead of using a priority encoder as in the aforementioned patent references, i.e., selecting a repeating portion according to fixed priority with respect to memory positions. That is, generally speaking, when data is stored in a plurality of positions, it is advantageous to select a position in which the data has been recently written.

SUMMARY

It is an object of the various embodiments described herein to increase the probability of successfully selecting a position in which data has been recently written from a plurality of positions in which the data is stored. In accordance with an aspect of the various embodiments described herein, an apparatus is provided for selecting a specific position from a plurality of positions in a memory to which data elements are cyclically written. A specific data element is stored in the plurality of positions. The apparatus comprises a determination unit for determining whether the plurality of positions include any position in a specific area of the memory to which data elements are written in a current cycle. The apparatus further comprises a selection unit. If the determination unit determines that the plurality of positions include any position in the specific area, then the selection unit selects at least one position in the specific area out of the plurality of positions as the specific position. If the determination unit determines that the plurality of positions do not include any position in the specific area, then the selection unit selects at least one position out of the plurality of positions as the specific position.

The apparatus further may comprise a signal generation unit for generating a plurality of signals indicating the plurality of positions. If the determination unit determines that the plurality of positions include any position in the specific area, the selection unit may select at least one position in the specific area on the basis of at least one signal. The at least one signal may be obtained by masking each signal out of the plurality of signals generated by the signal generation unit that indicates a position in an area other than the specific area. In such case, the apparatus further may comprise a storage unit for storing a mask pattern to be used by the selection unit to mask a signal. In a case in which the specific area is expanded, the mask pattern may be modified so as not to mask each signal indicating a position in an area of the memory that is newly included in the specific area. Moreover, the apparatus further may comprise a storage unit for storing a mask pattern to be used by the selection unit to mask a signal, and a generation unit for generating the mask pattern on the basis of a signal that indicates a boundary between the specific area and an area other than the specific area.

Moreover, the apparatus further may comprise a signal generation unit for generating a plurality of signals indicating the plurality of positions. The determination unit may determine whether the plurality of positions include any position in the specific area on the basis of a result of performing an OR operation involving at least one signal. The at least one signal may be obtained by masking each signal out of the plurality of signals that indicates a position in an area other than the specific area.

In accordance with a further aspect of the various embodiments described herein, an apparatus is provided for selecting a specific address from a plurality of addresses in a memory to which data elements are cyclically written in address order. A specific data element is stored at the plurality of addresses. The apparatus comprises a signal generation unit for generating a plurality of signals indicating the plurality of addresses. The apparatus further comprises a determination unit for determining whether any of the plurality of signals generated by the signal generation unit indicates an address at which a data element is written before a data element is written at a current address in a single cycle. The apparatus further comprises an extraction unit. If the determination unit determines that any of the plurality of signals indicates an address at which a data element is written before a data element is written at the current address, then the extraction unit extracts a signal group out of the plurality of signals including at least one signal obtained by masking each signal indicating an address at which a data element is written after a data element is written at the current address in the single cycle. If the determination unit determines that none of the plurality of signals indicates an address at which a data element is written before a data element is written at the current address, then the extraction unit extracts a signal group including the plurality of signals.

The apparatus further may comprise an output unit for outputting a signal indicating the specific address. The signal indicating the specific address is selected out of signals constituting the signal group extracted by the extraction unit. The signal indicating the specific address indicates an address at which a data element is written in the single cycle. The specific address may be the highest address indicated by the signals constituting the signal group extracted by the extraction unit.

In accordance with a further aspect of the various embodiments described herein, an apparatus is provided for encoding a specific data element group with respect to a plurality of data elements stored in a memory to which data elements are cyclically written. The apparatus comprises a detection unit for detecting, for each data element constituting the specific data element group, a plurality of positions in the memory, the data element being stored in the plurality of positions. The apparatus further comprises a determination unit for determining, for each data element constituting the specific data element group, whether the plurality of positions detected by the detection unit include any position in a specific area of the memory, to which data elements are written in a current cycle. The apparatus further comprises a selection unit. If the determination unit determines that the plurality of positions include any position in the specific area, then the selection unit selects, for each data element constituting the specific data element group, a position in the specific area out of the plurality of positions. If the determination unit determines that the plurality of positions do not include any position in the specific area, then the selection unit selects, for each data element constituting the specific data element group, a position out of the plurality of positions.

The apparatus further may comprise an encoding unit for encoding the specific data element group using the position selected by the selection unit regarding a specific data element constituting the specific data element group and a number of times the position is continuously selected by the selection unit, if the position is continuously selected by the selection unit.

In accordance with a further aspect of the various embodiments described herein, a method is provided for selecting a specific position from a plurality of positions in a memory to which data elements are cyclically written. A specific data element is stored in the plurality of positions. The method comprises determining whether the plurality of positions include any position in a specific area of the memory to which data elements are written in a current cycle. The method further comprises selecting at least one position in the specific area out of the plurality of positions as the specific position if it is determined that the plurality of positions include any position in the specific area, and selecting at least one position out of the plurality of positions as the specific position if it is determined that the plurality of positions do not include any position in the specific area.

The method further may comprise generating a plurality of signals indicating the plurality of positions. If it is determined that the plurality of positions include any position in the specific area, the method further may comprise selecting at least one position in the specific area on the basis of at least one signal obtained by masking each signal out of the plurality of signals that indicates a position in an area other than the specific area. The method further may comprise storing a mask pattern to be used to mask a signal and, on condition that the specific area is expanded, modifying the mask pattern so as not to mask each signal indicating a position in an area of the memory that is newly included in the specific area. Moreover, the method further may comprise storing a mask pattern to be used by the selection unit to mask a signal and generating the mask pattern on the basis of a signal that indicates a boundary between the specific area and an area other than the specific area.

Additionally, the method further may comprise generating a plurality of signals indicating the plurality of positions. The method further may comprise determining whether the plurality of positions include any position in the specific area on the basis of a result of performing an OR operation involving at least one signal obtained by masking each signal out of the plurality of signals that indicates a position in an area other than the specific area.

In accordance with the various embodiments described herein, there is increased probability of successfully selecting a position in which data has been recently written from a plurality of positions in which the data is stored.

BRIEF DESCRIPTION OF THE DRAWINGS

The various embodiments are to be described in detail with reference to the attached drawings, in which.

DETAILED DESCRIPTION

First Implementation

Figure 1:
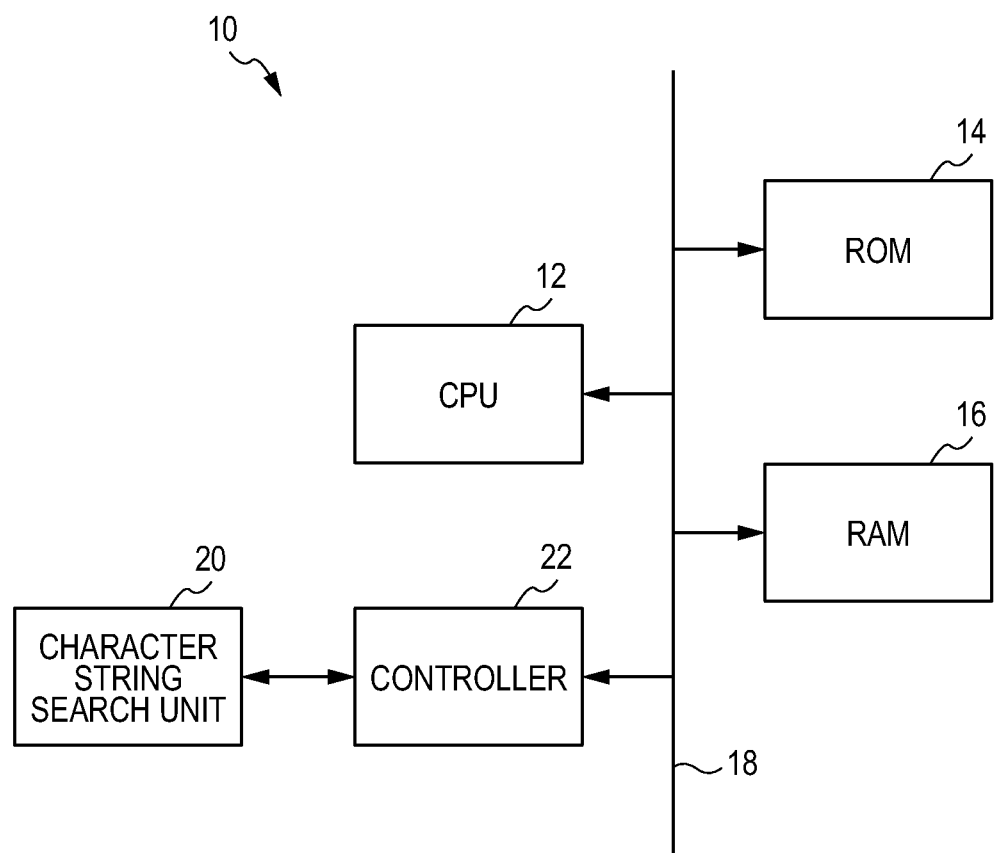
FIG. 1 is a diagram showing an exemplary configuration of a microcomputer to which an exemplary embodiment is applied.

A first implementation now will be described. FIG. 1 shows a portion of the configuration of a microcomputer 10 in accordance with an exemplary embodiment. The microcomputer 10 comprises a CPU 12, a ROM 14, and a RAM 16 interconnected via a bus 18 including an address bus, a data bus, a control bus, and the like. The microcomputer 10 further comprises a character string search unit 20. The character string search unit 20 is connected to the bus 18 via a controller 22, which controls the operations of the character string search unit 20.

Figure 2:
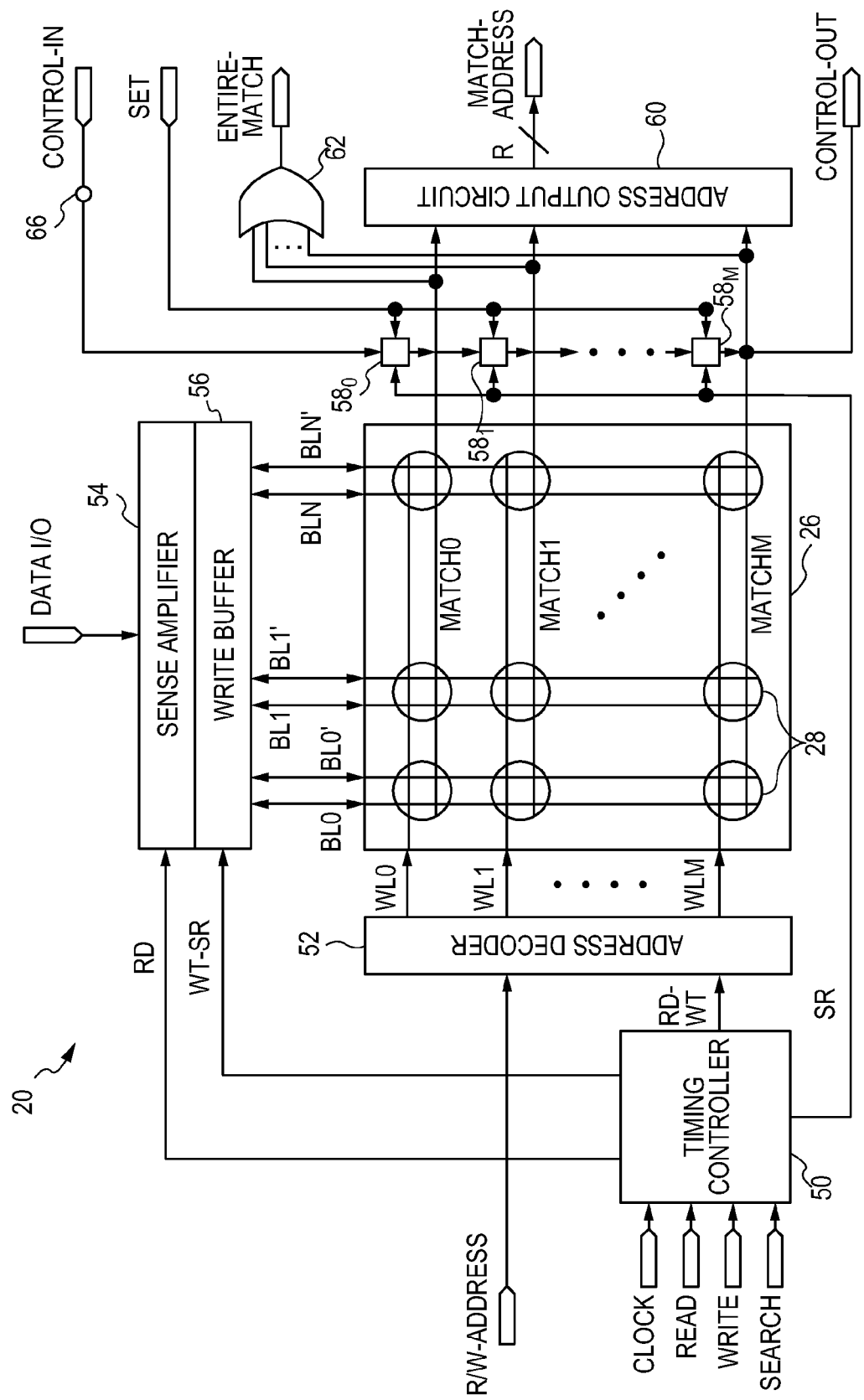
FIG. 2 is a block diagram showing an exemplary configuration of a character string search unit according to an exemplary embodiment.

FIG. 2 is a diagram showing the character string search unit 20 according to an exemplary embodiment. The character string search unit 20 comprises a content addressable memory cell array 26 in which many content addressable memory cells (unit cells) 28, indicated by circles in the drawing, are arranged in a matrix. In the content addressable memory cell array 26, (M+1) word lines WL0 to WLM, (M+1) match lines MATCH0 to MATCHM, and (N+1) groups of bit line pairs BL0 and BL0' to BLN and BLN' are arranged in a matrix. Each of the content addressable memory cells 28 is connected to one of the word lines WL0 to WLM, one of the match lines MATCH0 to MATCHM, and one of the bit line pairs BL0 and BL0' to BLN and BLN'.

Figure 3:
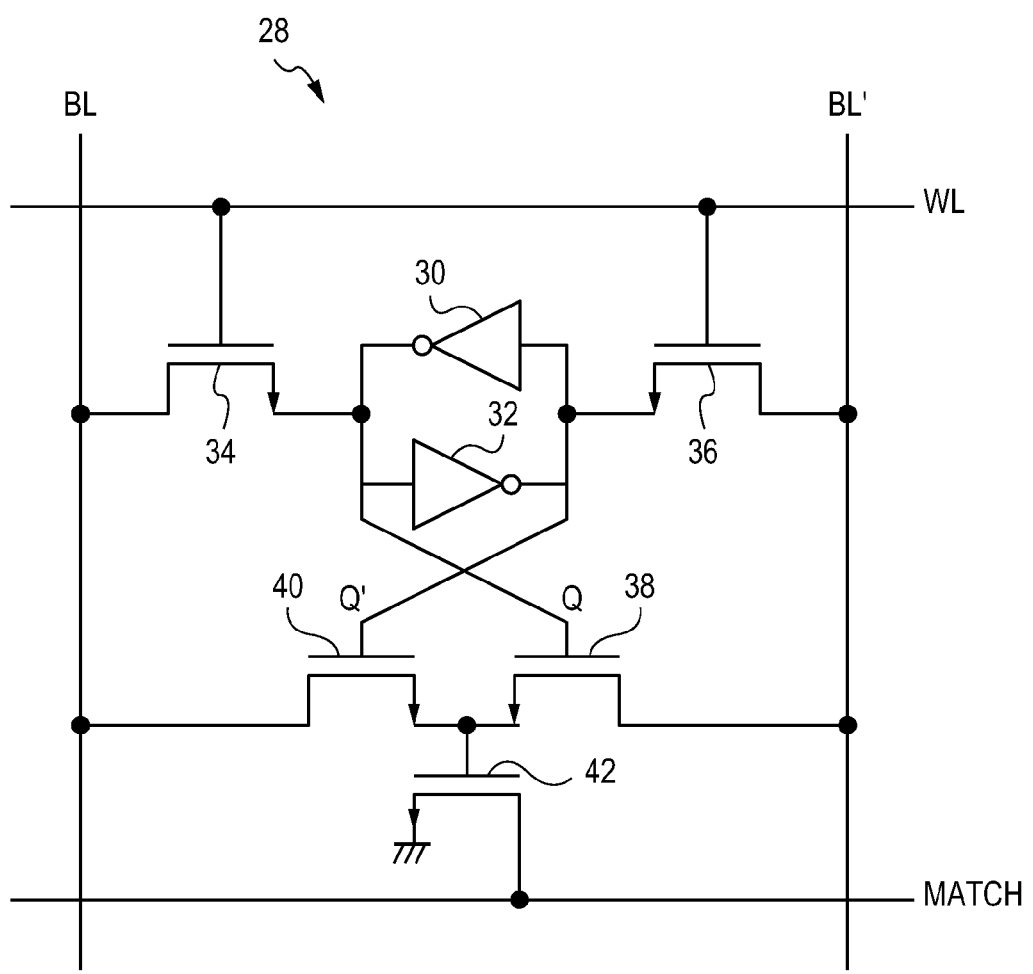
FIG. 3 is a circuit diagram showing an exemplary configuration of a content addressable memory cell according to an exemplary embodiment.

FIG. 3 is a circuit diagram showing a configuration of the content addressable memory cell 28 in accordance with an exemplary embodiment. Each of the content addressable memory cells 28 has the same configuration. Each of the content addressable memory cells 28 comprises two NOT circuits (i.e., inverters) 30 and 32. As shown in FIG. 3, the input terminal of the NOT circuit 30 is connected to the output terminal of the NOT circuit 32, and the output terminal of the NOT circuit 30 is connected to the input terminal of the NOT circuit 32. A loop created as a result of the configuration of the NOT circuits 30 and 32 constitutes a storage circuit (SRAM type) that stores a bit of data. The output terminal of the NOT circuit 30 is connected to the source of an N channel MOSFET 34, and the output terminal of the NOT circuit 32 is connected to the source of an N channel MOSFET 36. The respective gates of the MOSFETs 34 and 36 are connected to a corresponding word line WL. Furthermore, the respective drains of the MOSFETs 34 and 36 are respectively connected to corresponding bit lines BL and BL'.

When a bit of data is written to the content addressable memory cell 28 (in accordance with a "write" mode further described herein), the word line WL is set to high level, the bit line BL is set to a level corresponding to the write data D (high level when D is "1", and low level when D is "0"), and the bit line BL' is set to a level that is the inverse of the level of the bit line BL (low level when the bit line BL is at high level, and high level when the bit line BL is at low level). As a result, the MOSFETs 34 and 36 are turned on, and the data supplied via the bit line pair BL and BL' is held in the loop resulting from the configuration of the NOT circuits 30 and 32. In this case, the data stored in the content addressable memory cell 28 is readable (in accordance with a "read" mode further described herein).

Furthermore, the output terminal of the NOT circuit 30 is connected to the gate of a MOSFET 38, and the output terminal of the NOT circuit 32 is connected to the gate of a MOSFET 40. In this case, data Q', which is the inverse of the data D, is output from the NOT circuit 32, and data Q (=D), which is the inverse of the data Q', is output from the NOT circuit 30. The respective drains of the MOSFETs 38 and 40 are respectively connected to the bit lines BL' AND BL, and the respective sources of the MOSFETs 38 and 40 are connected to the gate of a MOSFET 42. The drain of the MOSFET 42 is connected to a corresponding match line MATCH, and the source of the MOSFET 42 is grounded.

In accordance with an exemplary embodiment, the number of the content addressable memory cells 28 connected to the same word line and match line matches the number of bits expressing one character constituting a character string to be searched (e.g., eight bits for ASCII code, ISO code, or the like). A character of character data is stored in the plurality of content addressable memory cells 28 connected to the same word line and match line (hereinafter referred to as a content addressable memory cell row). Furthermore, in the content addressable memory cell array 26, an address is assigned to each content addressable memory cell row.

In this case, character data is an exemplary data element. Moreover, the content addressable memory cell array 26 is an exemplary signal generation unit for generating a plurality of signals indicating a plurality of positions where data elements are stored. Furthermore, the content addressable memory cell array 26 is an exemplary detection unit for detecting a plurality of positions in a memory where data elements are stored.

Referring again to FIG. 2, the character string search unit 20 further comprises a timing controller 50. Moreover, the operational modes of the character string search unit 20 include the "read" mode, in which data stored in the content addressable memory cell array 26 is read, the "write" mode, in which data is written to the content addressable memory cell array 26, and a "search" mode in which data stored in the content addressable memory cell array 26 is searched. The timing controller 50 is connected to the controller 22. Switching is performed between these operational modes in response to a read instruction READ, a write instruction WRITE, and a search instruction SEARCH input to the timing controller 50 from the controller 22.

A system clock CLOCK is input from the controller 22 to the timing controller 50. The timing controller 50 generates and outputs four clocks (a clock RD, a clock WT-SR, a clock RD-WT, and a clock SR) in synchronization with the system clock CLOCK in a manner that depends on the three operational modes.

The clock RD-WT is output to an address decoder 52 connected to the timing controller 50 during "read" and "write" operations in order to operate the address decoder 52. The address decoder 52 is connected to the controller 22, and the controller 22 indicates to the address decoder 52 the address of a content addressable memory cell row at which data is read or written. The word lines WL0 to WLM are connected to the address decoder 52. The corresponding word line for the content addressable memory cell row corresponding to the indicated address is set to high level.

A sense amplifier 54 and a write buffer 56 are connected to the timing controller 50. During a "read" operation, the clock RD is output to the sense amplifier 54 in order to operate the sense amplifier 54. During "write" and "search" operations, the clock WT-SR is output to the write buffer 56 in order to operate the write buffer 56. The bit line pairs BL0 AND BL0' to BLN AND BLN' are connected to the sense amplifier 54 and the write buffer 56. Furthermore, the sense amplifier 54 and the write buffer 56 are connected to the controller 22.

During a "read" operation, the sense amplifier 54 changes the respective levels (representing read data) of the bit line pairs BL0 AND BL0' to BLN AND BLN' in a manner that depends on data stored in the respective content addressable memory cells 28 in a content addressable memory cell row, and outputs the respective levels to the controller 22. During "write" and "search" operations, the write buffer 56 changes the respective levels of the bit line pairs BL0 AND BL0' to BLN AND BLN' in a manner that depends on data input from the controller 22 and stored in the buffer (i.e., the write buffer 56 drives the bit line pairs). During a "search" operation, the address decoder 52 is not operated in the aforementioned manner, and all of the word lines WL0 to WLM are set to low level. Thus, the respective levels of the bit line pairs changed in a manner that depends on search data are not fetched by the content addressable memory cells 28, i.e., search data is not written to the content addressable memory cells 28.

The character string search unit 20 further comprises (M+1) precharge controllers $58_0$ to $58_M$ that are connected to the timing controller 50. During a "search" operation, the clock SR is output to the precharge controllers $58_0$ to $58_M$ in order to operate the precharge controllers $58_0$ to $58_m$. The precharge controller $58_0$ is connected to the controller 22 via a terminal 66 and also is connected to the match line MATCH0. The precharge controller $58_1$ is connected to the match lines MATCH0 and MATCH1. Each of the precharge controller $58_2$ and the following precharge controllers is connected to two adjacent corresponding match lines in the same way as the precharge controller $58_1$. Furthermore, the precharge controller $58_M$ is connected to the controller 22 via the match line MATCHM.

Figure 4:
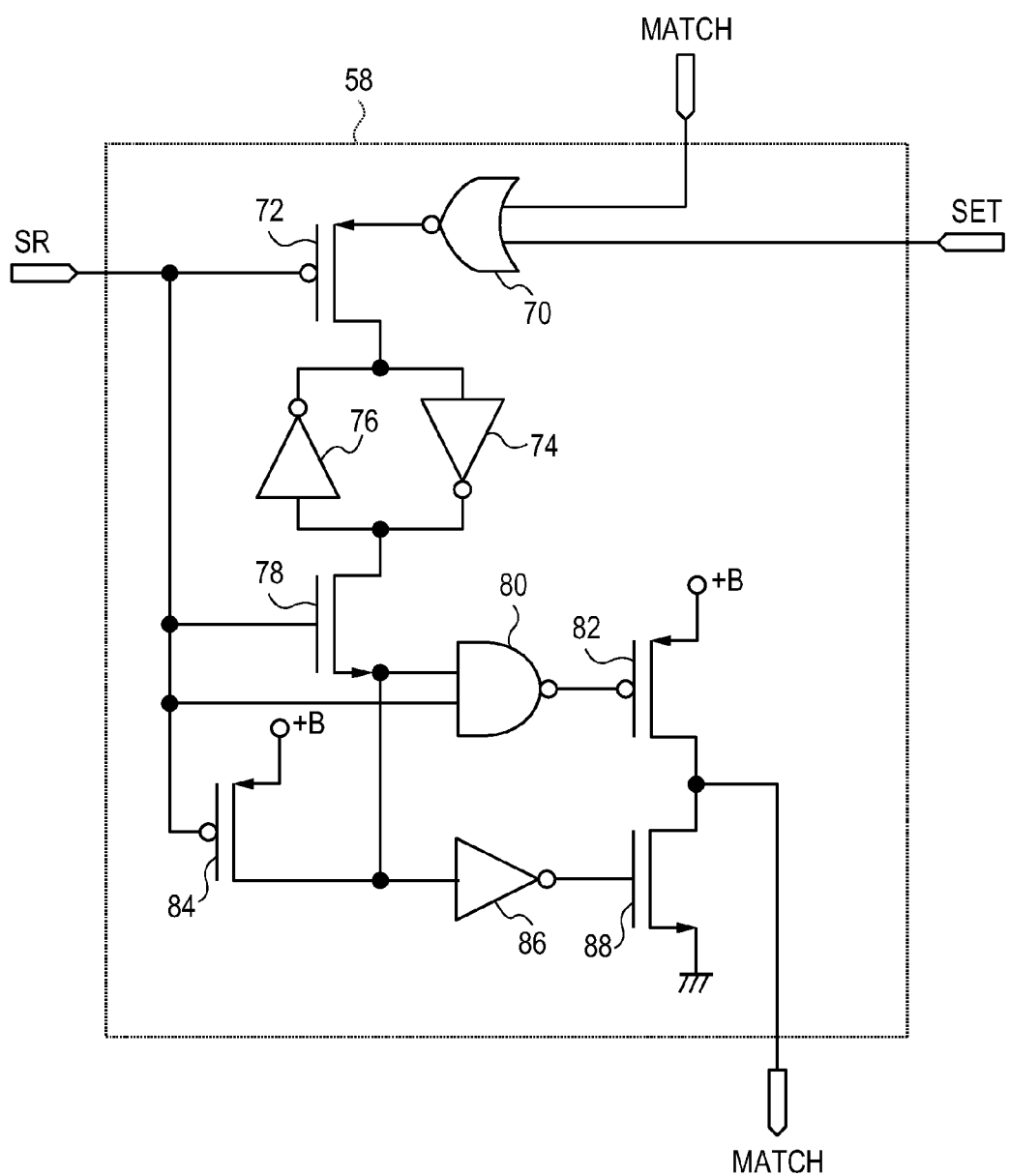
FIG. 4 is a circuit diagram showing an exemplary configuration of a precharge controller according to an exemplary embodiment.

FIG. 4 is a circuit diagram showing a configuration of the precharge controller 58 in accordance with an exemplary embodiment. Each of the precharge controllers $58_0$ to $58_M$ has the same configuration. As shown in FIG. 4, the precharge controller 58 comprises a NOR circuit 70, and one of the input terminals of the NOR circuit 70 is usually connected to a preceding match line (e.g., the match line MATCH0 for the precharge controller $58_1$). However, instead of being connected to a preceding match line, the precharge controller $58_0$ is connected to the controller 22 via the terminal 66, and a low level signal is always input from the controller 22 as an input signal CONTROL-IN. The other input terminal of the NOR circuit 70 is connected to the controller 22. More specifically, a signal SET (also shown in FIG. 2), which is usually set to low level but is set to high level when all of the match lines MATCH0 to MATCHM are charged to high level (precharged), is input to the precharge controllers $58_0$ to $58_M$ from the controller 22. The output terminal of the NOR circuit 70 is connected to the source of a P channel MOSFET 72. The gate of the MOSFET 72 is connected to the timing controller 50 via the clock SR. During a "search" operation, the clock SR at high level is input to the gate of the MOSFET 72.

The input terminal of a NOT circuit 74 and the output terminal of a NOT circuit 76 are connected to the drain of the MOSFET 72. The output terminal of the NOT circuit 74 and the input terminal of the NOT circuit 76 are connected to the drain of an N channel MOSFET 78. Thus, the loop created as a result of the configuration of the NOT circuits 74 and 76 constitutes a storage circuit. The gate of the MOSFET 78 is connected to the timing controller 50 via the clock SR, and the clock SR at high level is input to the gate of the MOSFET 78 during a "search" operation. The source of the MOSFET 78 is connected to one of the input terminals of a NAND circuit 80, and the other input terminal of the NAND circuit 80 is connected to the timing controller 50 via the clock SR.

The output terminal of the NAND circuit 80 is connected to the gate of a P channel MOSFET 82. The source of the MOSFET 82 is connected to a power source (not shown), and the drain of the MOSFET 82 is connected to a corresponding following match line (e.g., the match line MATCH1 for the precharge controller $58_1$). Furthermore, the timing controller 50 is connected to the gate of a P channel MOSFET 84 via the clock SR. The source of the MOSFET 84 is connected to the power source, and the drain of the MOSFET 84 is connected to the input terminal of a NOT circuit 86. The input terminal of the NOT circuit 86 also is connected to the source of the MOSFET 78. The output terminal of the NOT circuit 86 is connected to the gate of an N channel MOSFET 88. The source of the MOSFET 88 is grounded, and the drain of the MOSFET 88 is connected to the aforementioned following match line.

On the other hand, referring again to FIG. 2, each of the match lines MATCH0 to MATCHM is connected to an address output circuit 60. In a content addressable memory cell row, a match line of which is set to high level after a comparison operation is performed once in the "search" mode, stored data matches supplied data. The address output circuit 60 is connected to the controller 22 and outputs to the controller 22 an address MATCH-ADDRESS of a content addressable memory cell row, a match line of which is set to high level by performing a "search" operation. However, when a plurality of match lines are at high level, the address output circuit 60 outputs, as the address MATCH-ADDRESS, the address of a content addressable memory cell row determined by a selection operation described herein.

Furthermore, each of the match lines MATCH0 to MATCHM is connected to input terminals of an OR circuit 62. The output terminal of the OR circuit 62 is connected to the controller 22. The OR circuit 62 outputs to the controller 22 a signal indicating whether at least one of the match lines MATCH0 to MATCHM is at high level, i.e., a signal ENTIRE-MATCH indicating whether search data matches data stored in the content addressable memory cell array 26.

Figure 5:
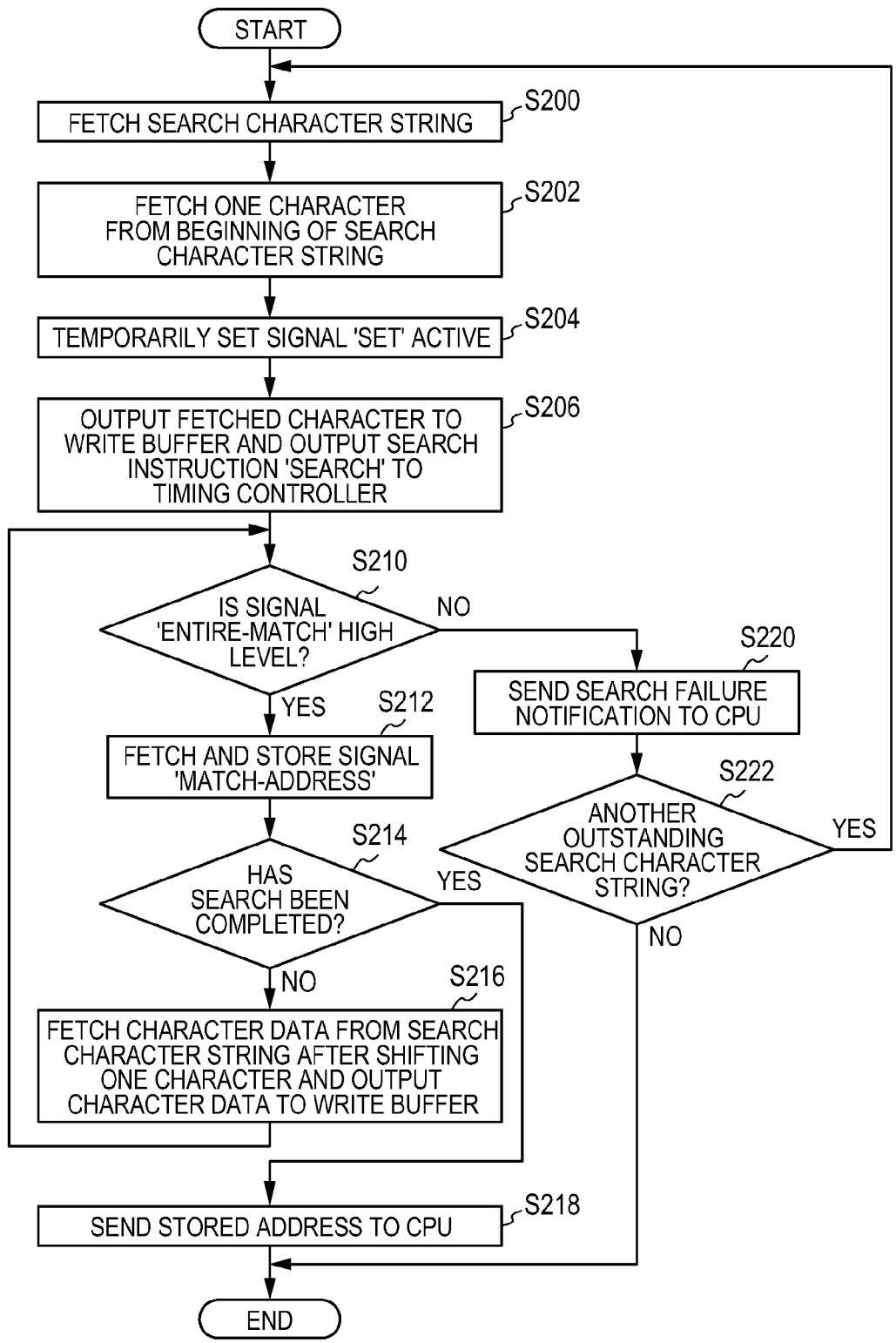
FIG. 5 is a flowchart showing an exemplary operation of a controller according to an exemplary embodiment.

FIG. 5 is a flowchart showing an exemplary operation of the character string search unit 20 performing a search for a character string in the "search" mode in accordance with an exemplary embodiment. The flowchart shows the flow of the process to be performed by the controller 22 in response to an instruction from the CPU 12. Furthermore, for purposes of this discussion, it is assumed that character string data already has been stored in the content addressable memory cells 28 of the content addressable memory array 26 as data to be searched.

When a search is commenced, the controller 22 first fetches character string data expressing a search character string that is stored in, e.g., the RAM 16 (step 200). Then, a character of character data is fetched from the beginning of the fetched search character string data (step 202). Subsequently, the signal SET provided to the precharge controllers $58_0$ to $58_M$ is temporarily set active (high level) (step 204).

When the signal SET input to each of the respective NOR circuits 70 of the precharge controllers $58_0$ to $58_M$ is temporarily set to high level, a signal output from the NOR circuit 70 consequently is set to low level. Referring again to FIG. 4, because the MOSFET 72 is a P channel type, the MOSFET 72 is on while the clock SR is at low level. Thus, the signal output from the NOR circuit 70 is input to the NOT circuit 74 and is held in the loop of the NOT circuits 74 and 76.

Furthermore, the controller 22 outputs the character data fetched from the search character string data to the write buffer 56 and also outputs, in synchronization with temporarily setting the signal SET to high level, the search instruction SEARCH to the timing controller 50 (step 206). Thus, the timing controller 50 outputs the clock WT-SR to the write buffer 56 and the clock SR to the precharge controllers $58_0$ to $58_m$. As a result, the match lines MATCH are precharged in the respective precharge controllers 58.

More specifically, when the clock SR is input to the precharge controller 58, while the clock SR is at high level, the MOSFET 72 of the precharge controller 58 is turned off, and the MOSFET 78 is turned on. Thus, a high level signal is output from the NOT circuit 74 to be input to one of the input terminals of the NAND circuit 80. Since a high level signal is also input to the other input terminal of the NAND circuit 80, a signal output from the NAND circuit 80 is set to low level. Thus, the MOSFET 82 is turned on, and the match line MATCH is connected to the power source. At this time, the match line MATCH is at high level because the MOSFET 88 is off.

Furthermore, when the clock SR is set to low level, the one input terminal of the NAND circuit 80 is set to low level. Thus, a signal output from the NAND circuit 80 is set to high level, and the MOSFET 82 is turned off. Moreover, the MOSFET 78 is turned off, and the MOSFET 84 is turned on. As a result, a high level signal is supplied from the power source to the NOT circuit 86, and the MOSFET 88 is maintained off. Thus, the match line MATCH is at high level state and is electrically disconnected from the precharge controller 58. The match lines MATCH0 to MATCHM are charged to high level (precharged) by performing the aforementioned operation in the respective precharge controllers $58_0$ to $58_m$.

When the clock WT-SR is input to the write buffer 56, the write buffer 56 drives the bit line pairs BL0 AND BL0' to BLN AND BLN' in response to the input character data. In each of the content addressable memory cells 28 of the content addressable memory cell array 26 (FIG. 3), when the data Q output from the NOT circuit 30 is "1" (high level), the MOSFET 38 is turned on, and when the data Q' output from the NOT circuit 32 is "1", the MOSFET 40 is turned on. Thus, when the data Q (Q') held in the loop of the NOT circuits 30 and 32 matches the data D (D') supplied via the bit line pair BL and BL', the MOSFET 42 is not turned on. Conversely, when the data Q (Q') does not match the data D (D'), current flows from the drain to source of one of the MOSFETs 38 and 40 that is on. Thus, the MOSFET 42 is turned on, and the level of the precharged match line MATCH is lowered to low level (discharged).

The aforementioned comparison of data is performed simultaneously in the content addressable memory cells 28 while the clock SR is at low level. Thus, precharging and data comparison are performed during one cycle of the clock SR. In this case, since a plurality of the content addressable memory cells 28 (a content addressable memory cell row) are connected to a single match line MATCH, a comparison operation of comparing the character data stored in the content addressable memory cell row with the input character data is completed during one cycle of the clock SR. Each match line is maintained at high level only when the respective MOSFETs 42 of all of the content addressable memory cells 28 connected to the match line are not turned on, i.e., only when the character data stored in the content addressable memory cell row matches the character data input to the write buffer 56. When the character data stored in the content addressable memory cell row does not match the character data input to the write buffer 56, the match line is set to low level.

Thus, when the character data input to the write buffer 56 is stored in at least one of the content addressable memory cell rows, the signal ENTIRE-MATCH output via the OR circuit 62 is set to high level. Furthermore, while a comparison operation is being performed in the content addressable memory cell rows, the clock SR is at low level, and the MOSFET 72 in each of the precharge controllers 58 is turned on. Thus, the level of each of the match lines MATCH changed in a manner that depends on the comparison result of a corresponding content addressable memory cell row is transferred to and held in the NOT circuits 74 and 76 of the following precharge controller 58 (e.g., the level of the match line MATCH0 is transferred to the precharge controller $58_1$).

When the clock SR then is set to high level by the aforementioned operation, the MOSFET 78 is turned on. As is the case with precharging, when a signal output from the NOT circuit 74 is at high level, the MOSFET 82 is turned on, and the match line MATCH is charged to high level. Furthermore, when a signal output from the NOT circuit 74 is at low level, a signal output from the NOT circuit 86 is set to high level. Thus, the MOSFET 88 is turned on, and the match line MATCH is set to low level. In this manner, when a preceding match line is at high level, a following match line is set to high level, and when a preceding match line is at low level, a following match line is set to low level. In this case, the match line MATCH0 is always set to low level by the input signal CONTROL-IN input from the controller 22 to the precharge controller 58₀ after a comparison operation is performed once.

Subsequently, the controller 22 determines whether the signal ENTIRE-MATCH output from the OR circuit 62 is at high level (step 210). If it is determined that the signal ENTIRE-MATCH is at high level, the address MATCH-ADDRESS output from the address output circuit 60 is fetched and stored (step 212). Then, it is determined whether a search has been completed, i.e., whether the character data of all of the characters constituting the search character string has been output to the write buffer 56 (step 214).

If it is determined in step 214 that there is character data that has not been output to the write buffer 56 (i.e., a search has not been completed), character data is fetched from the search character string data after shifting one character and is output to the write buffer 56 (step 216). In this manner, in a content addressable memory cell row connected to a match line set to high level in the aforementioned operation, a comparison is performed on the character data output to the write buffer 56. Once the character data has been output to the write buffer 56, the process returns to step 210. Then, while the signal ENTIRE-MATCH is at high level, the controller 22 repeats the process from steps 210 to 216 until it is determined that there is no character data that has not been output to the write buffer 56. Each time step 212 is executed, the stored address (MATCH-ADDRESS) is updated.

Conversely, if it is determined in step 214 that there is no character data that has not been output to the write buffer 56 (i.e., a search has been completed), the controller 22 sends the stored address MATCH-ADDRESS to the CPU 12 in order to complete the process (step 218). Then, the process ends.

If it is determined in step 210 that the signal ENTIRE-MATCH is at low level, then it is determined that the search character string is not stored in the content addressable memory cell array 26. Thus, the controller 22 notifies the CPU 12 that the search has failed (step 220). Subsequently, the controller 22 determines whether there is another outstanding search character string (step 222). If in step 222 the controller 22 determines that there is another outstanding search character string, the process returns to step 200, and the controller 22 repeats the appropriate aforementioned process steps. Conversely, if in step 222 the controller 22 determines that there is no outstanding search character string, the controller 22 terminates the search operation, and the process ends.

The search operation described above with reference to the flowchart in FIG. 5 is exemplary, and accordingly modifications or additions to the operation may be made. For example, the respective addresses of a group of content addressable memory cell rows storing the longest character string matching the search character string may be obtained. In addition, the content addressable memory cells 28 are not limited to the SRAM type shown in FIG. 3; for example, a DRAM type memory cell may be adopted.

In the character string search unit 20 previously described, each time a character is input to the write buffer 56, the input character can be simultaneously compared with characters stored in all content addressable memory cell rows and thus can be rapidly searched for. Furthermore, a portion matching a character can be searched for within a clock cycle, and thus a rapid search can be performed.

Figure 6:
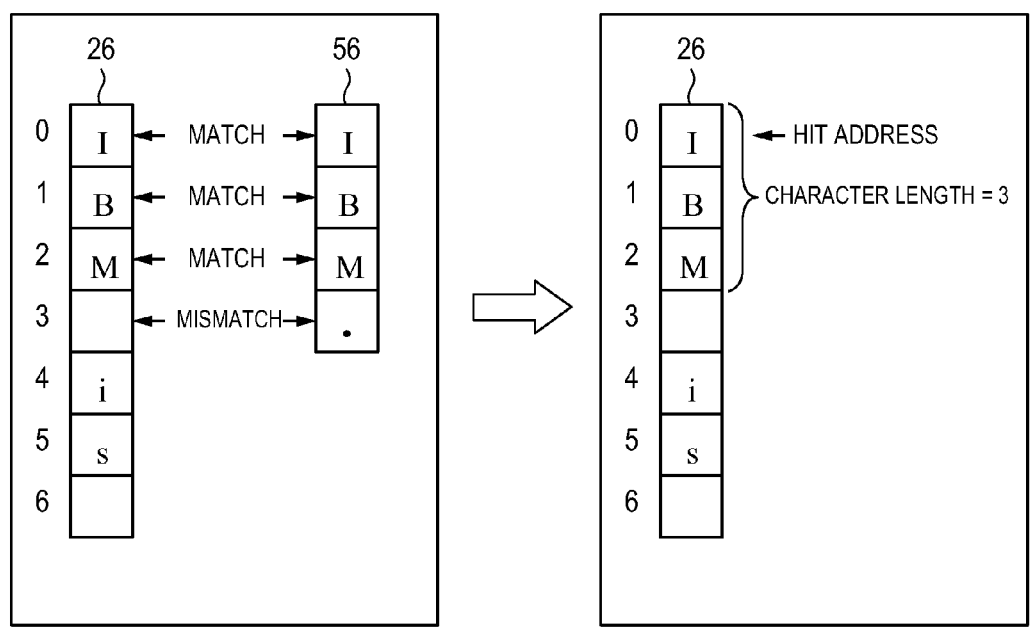
FIG. 6 is a diagram showing a specific exemplary character string search operation in which a hit occurs at a position.

FIG. 6 shows an exemplary character string search operation by the character string search unit 20. It is assumed that a character string "IBM is" is stored in the content addressable memory cell array 26 in sequence, as shown in the left portion of FIG. 6. Numbers depicted on the left side of the content addressable memory cell array 26 in FIG. 6 indicate the respective addresses of content addressable memory cell rows and correspond to values of M of the word line WLM (the match line MATCHM).

In this status, when a following character string "IBM." is input to the write buffer 56 of the character string search unit 20 on a character-by-character basis, the character string is sequentially compared with the character string stored in the content addressable memory cell array 26. More specifically, when the first character "I" is input to the write buffer 56, character data at address 0 matches the input character. As a result, the match line MATCH0 is maintained at high level. Moreover, when the second character "B" is input to the write buffer 56, character data at address 1 matches the input character. Consequently, the match line MATCH1 is maintained at high level. Furthermore, when the third character "M" is input to the write buffer 56, character data at address 2 matches the input character. As a result, the match line MATCH2 is maintained at high level. Then, when the last character "." (period) is input to the write buffer 56, character data at address 3 does not match the input character. Consequently, the match line MATCH3 is set to low level.

In the character string search unit 20, a continuous character string "IBM" is detected in this way in order to output an address at which a hit has been detected (hereinafter called "hit address") for the first time and the length of matching characters (in this case, hit address 0 and character length 3), as shown on the right portion of FIG. 6.

In a case in which a character string including a plurality of "IBM" instances is stored in the content addressable memory cell array 26, such as "IBMisIBMareIBM", searches involving the character string "IBM" will result in simultaneous hits at a plurality of positions. In such case, when one of the hits having occurred at a higher (or lower) memory address is simply selected by a priority encoder in a fixed manner (i.e., a selection scheme involving fixed priority is used), a hit address near an address at which a character to be newly input is written (a write address) may not be selected.

Figure 7:
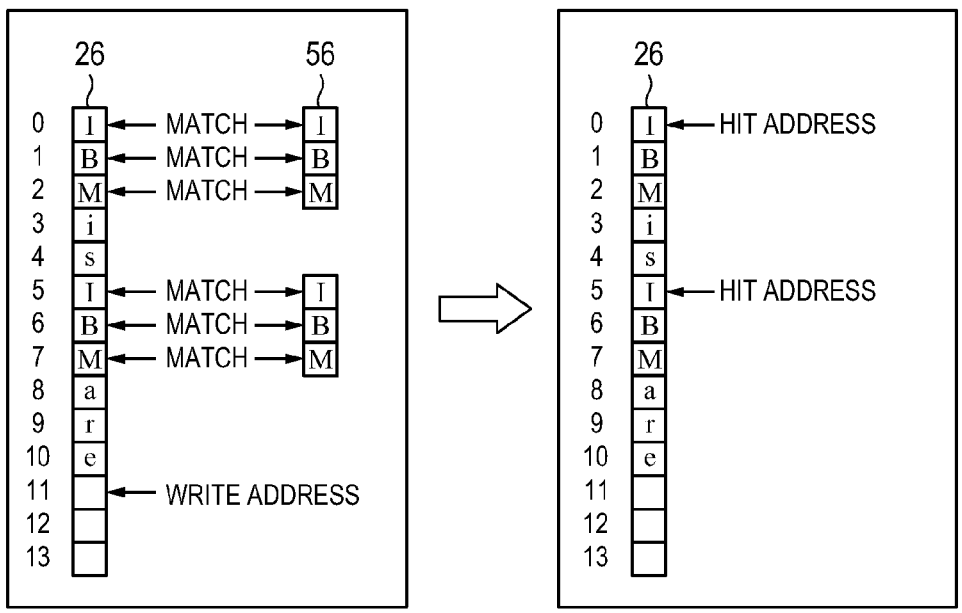
FIG. 7 is a diagram showing specific exemplary character string search operations in which hits occur at two positions.
Figure 7:
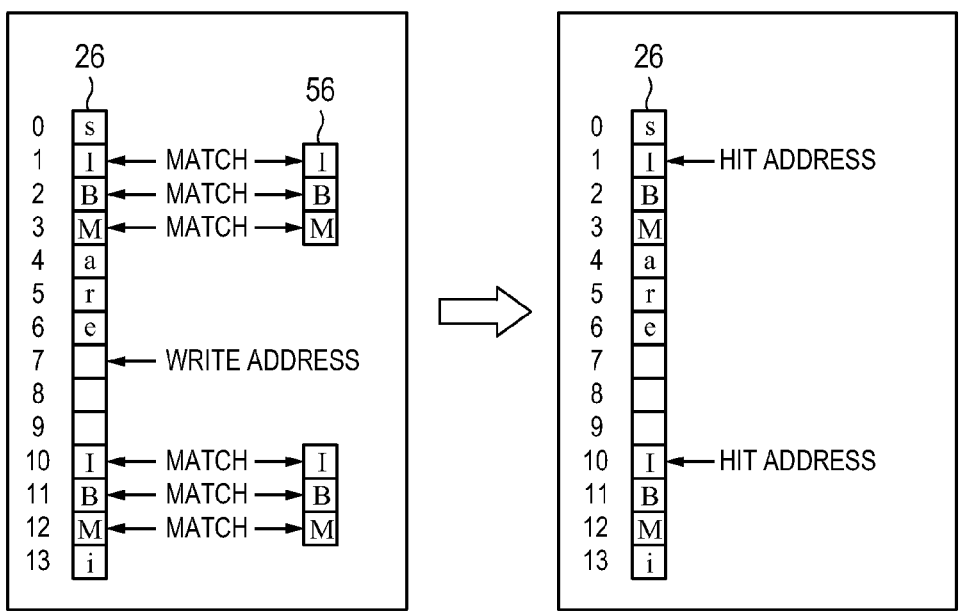

FIG. 7 shows an exemplary character string search operation in a case in which the content addressable memory cell array 26 is used. In such case, a character string "IBMisIBMareIBM" is provided as an example.

It is assumed that a portion "IBMisIBMare" of the character string "IBMisIBMareIBM" is stored in sequence in the content addressable memory cell array 26, as shown in the left portion of FIG. 7(*a*). Numbers described on the left side of the content addressable memory cell array 26 in FIG. 7 indicate the respective addresses of content addressable memory cell rows and correspond to values of M of the word line WLM (the match line MATCHM). Moreover, a "write address" in FIG. 7 corresponds to a signal R/W-ADDRESS input to the address decoder 52 in FIG. 2 and is the address of a content addressable memory cell row in which newly input data is stored. This write address is incremented by one each time data is written and is returned to address 0 upon reaching the highest address to continue writing data. That is, the content addressable memory cell array 26 is a ring buffer. In this manner, as much previously written data as the buffer size always resides in the content addressable memory cell array 26, and it is determined whether a character string to be newly written matches the previously written data. In the exemplary scenario illustrated in FIG. 7(*a*), the character string is stored at a location starting from address 0, and address 11 is a write address indicating a content addressable memory cell row in which a following character is to be stored.

In the exemplary search scenario illustrated in FIG. 7(*a*), in the character string search unit 20, when a character string "IBM" is input to the write buffer 56 on a character-by-character basis, the following character string is sequentially compared with the character string stored in the content addressable memory cell array 26. That is, when the first character "I" is input to the write buffer 56, respective pieces of character data at addresses 0 and 5 match the input character. Thus, the match lines MATCH0 and MATCH5 are maintained at high level. Furthermore, when the second character "B" is input to the write buffer 56, respective pieces of character data at addresses 1 and 6 match the input character. Thus, the match lines MATCH1 and MATCH6 are maintained at high level. Furthermore, when the third character "M" is input to the write buffer 56, respective pieces of character data at addresses 2 and 7 match the input character. Thus, the match lines MATCH2 and MATCH7 are maintained at high level. At this point, the character string "IBM" for which the search is conducted ends. Two character strings "IBM" reside in the content addressable memory cell array 26, and thus in this scenario it has been determined that hits have occurred at two positions.

In a scenario in which the character string is stored at the location starting from address 0, as shown in FIG. 7(a), address 5, which is a hit address near the write address, can be selected by selecting one of the two hit positions having a higher address according to fixed priority. However, the content addressable memory cell array 26 is repeatedly (cyclically) used as a ring buffer, as described above. Thus, at a certain point in time, the character string "IBMisIBMare" may be stored at, for example, a location starting from address 10, as shown in the left portion of FIG. 7(b). In this scenario, address 7 is a write address.

In the exemplary search scenario illustrated in FIG. 7(b), in the character string search unit 20, when the character string "IBM" is input to the write buffer 56 on a character-by-character basis, the following character string is sequentially compared with the character string stored in the content addressable memory cell array 26. That is, when the first character "I" is input to the write buffer 56, respective pieces of character data at addresses 1 and 10 match the input character. Thus, the match lines MATCH1 and MATCH10 are maintained at high level. Furthermore, when the second character "B" is input to the write buffer 56, respective pieces of character data at addresses 2 and 11 match the input character. Thus, the match lines MATCH2 and MATCH11 are maintained at high level. Furthermore, when the third character "M" is input to the write buffer 56, respective pieces of character data at addresses 3 and 12 match the input character. Thus, the match lines MATCH3 and MATCH12 are maintained at high level. At this point, the character string "IBM" for which the search is conducted ends. Two character strings "IBM" reside in the content addressable memory cell array 26. Thus, as in the previous scenario, in this scenario hits have occurred at two positions.

In this scenario, when one of the two hit positions having a higher address is selected according to fixed priority, address 1 that is a hit address near the write address cannot be selected, and address 10 that is a hit address distant from the write address is selected. In a method such as deflate compression, the compression rate is improved by selecting, among repeating portions where a certain character string is repeated, a repeating portion at the closest position and assigning a code with a shorter bit length to a repeating portion residing at a closer position. Thus, in a scenario such as that illustrated in FIG. 7(b), the compression rate deteriorates.

In accordance with an exemplary embodiment described herein, a hit address closest to a write address in the order of writing can be selected, regardless of the location in the content addressable memory cell array 26 at which a character string is stored.

When character strings located at a plurality of positions are hit, one of the character strings needs to be selected. In deflate compression, compression is performed by encoding the number of characters from a write address to a matching character string and the number of characters included in the matching character string. In this case, the smaller the number of characters from the write address, the shorter the bit length to be assigned. Thus, the compression rate can be improved by selecting a hit address closest to the write address when hits have occurred at a plurality of positions (such a compression method is adopted because the probability is high that a repeating portion where a certain character string is repeated will reside near the character string). In the case of deflate compression, as defined by RFC 1951, the bit length assigned to the nearest hit address is only five bits, but the bit length assigned to the farthest hit address is eighteen bits. The latter is 3.6 times as long as the former. Thus, when an optimum hit address can be selected, the compression rate can be improved.

Figure 8:
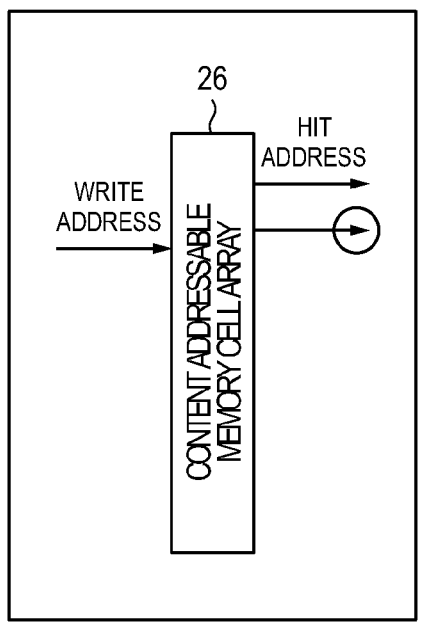
FIG. 8 is a diagram describing a hit to be selected when a plurality of hits occur according to an exemplary embodiment.
Figure 8:
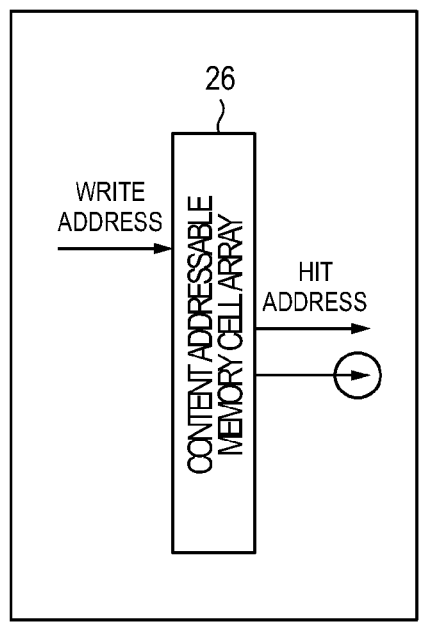
Figure 8:
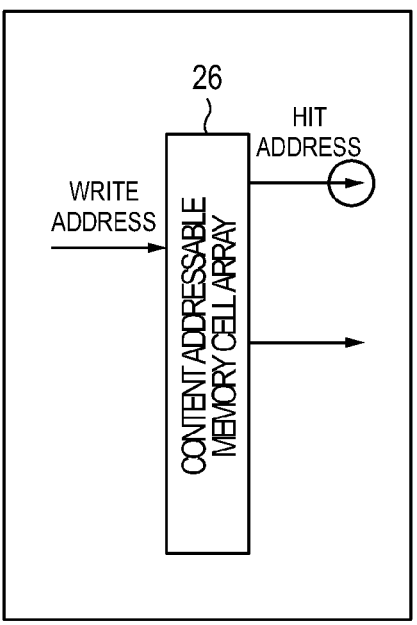
Figure 8:
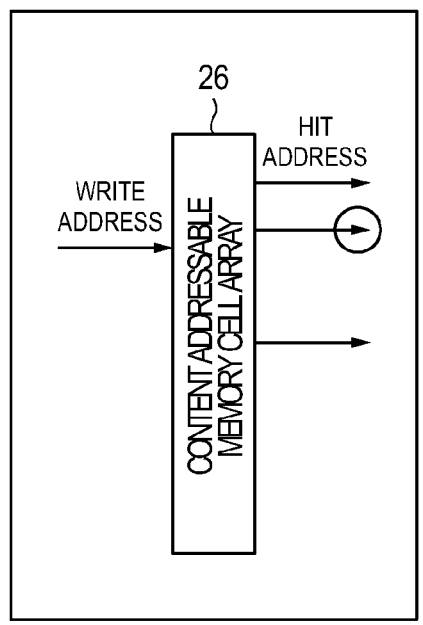

FIG. 8 shows the selection of an optimum hit address for each of the relationships between a write address and a plurality of hit addresses in accordance with an exemplary embodiment. In the drawing, it is assumed that addresses are assigned in ascending order from the top to bottom of the content addressable memory cell array 26.

Case 1, shown in FIG. 8(a), is a case where a plurality of hits have occurred at respective addresses lower than the write address. In this case, the highest hit address (indicated by a circle in FIG. 8(a)) is an optimum value, i.e., a hit address nearest to the write address.

Case 2, shown in FIG. 8(b), is a case where a plurality of hits have occurred at respective addresses higher than the write address. In this case, the highest hit address (indicated by a circle in FIG. 8(b)) is an optimum value, i.e., a hit address nearest to the write address.

Case 3, shown in FIG. 8(c), is a case where a hit has occurred at an address lower than the write address, and another hit has occurred at an address higher than the write address. In this case, the lower hit address (indicated by a circle in FIG. 8(c)) is an optimum value, i.e., a hit address nearest to the write address.

Case 4, shown in FIG. 8(d), is a case where a plurality of hits have occurred at respective addresses lower than the write address, and another hit has occurred at an address higher than the write address. In this case, the highest hit address that is lower than the write address (indicated by a circle in FIG. 8(d)) is an optimum value, i.e., a hit address nearest to the write address.

Using techniques in the known art, it is difficult to select an optimum hit address. Thus, in accordance with an exemplary embodiment, selection rules now will be provided that involve partitioning the content addressable memory cell array 26 into an address area lower than the write address (hereinafter called a "low address area") and an address area higher than the write address (hereinafter called a "high address area"), with a write address serving as a boundary between the low address area and the high address area. Specifically, a hit address closest to a write address in the order of writing can be selected according to the following rules:

(Rule 1) When any hit address resides in the low address area, the highest hit address is selected, ignoring any hit address in the high address area.

(Rule 2) When no hit address resides in the low address area, the highest hit address is selected.

Figure 9:
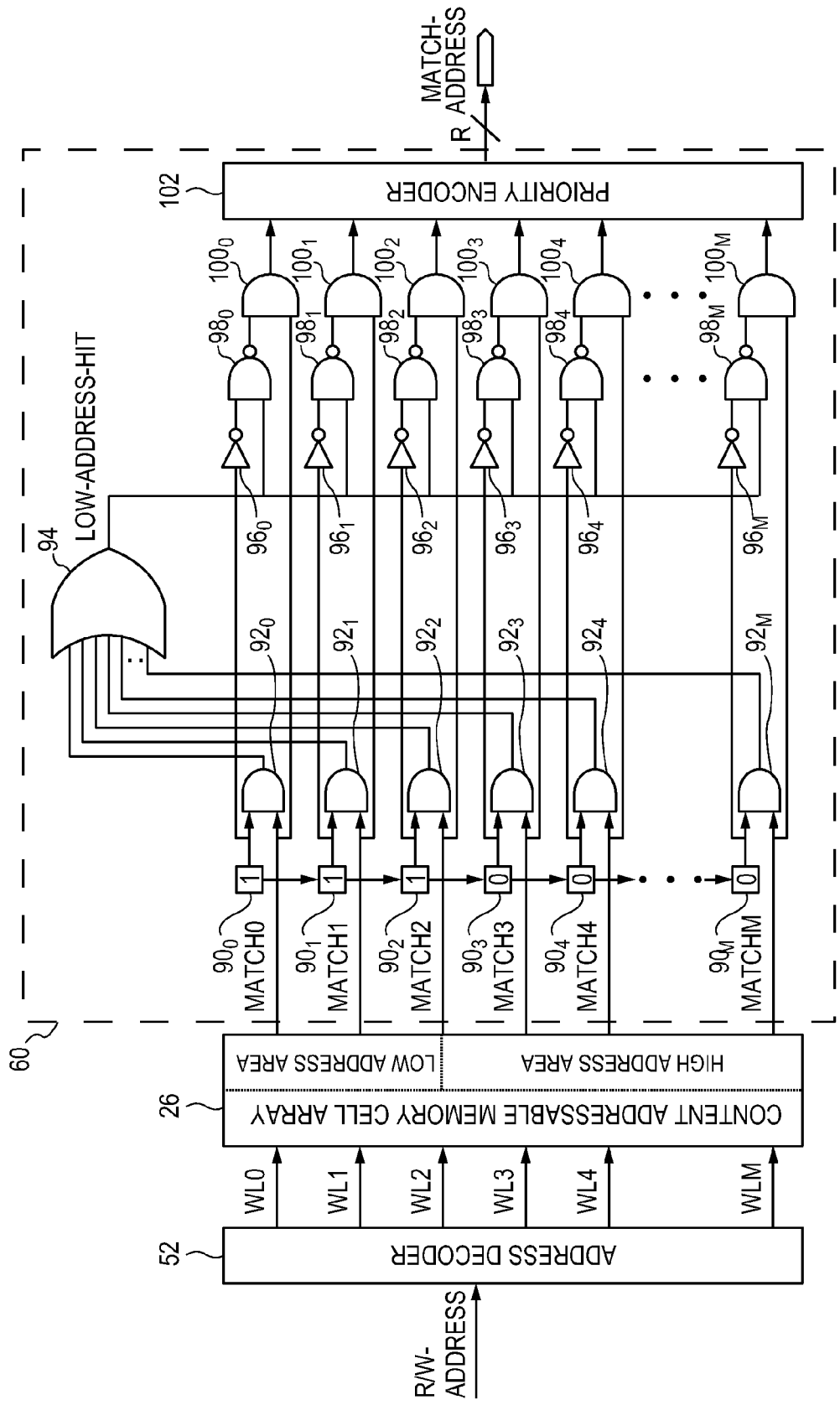
FIG. 9 is a diagram showing an exemplary configuration of an address output circuit according to an exemplary embodiment.

A mask pattern for separating a low address area from a high address area may be generated via a hardware implementation. FIG. 9 is a diagram showing a configuration of the address output circuit 60 of the character string search unit 20 in accordance with an exemplary embodiment. FIG. 9 shows the relationship between the address output circuit 60 and other components of the character string search unit 20 previously discussed with reference to FIG. 2. In accordance with this configuration, latches (flip-flops) $90_0$ to $90_M$ constitute a mask pattern, and each of the latches $90_0$ to $90_M$ holds one bit. In the mask pattern, each time the write address is incremented by one, the latches $90_0$ to $90_M$ are shifted as a whole.

An exemplary method for generating the mask pattern may include the following steps:

(1) At the time of resetting, the latches $90_0$ to $90_M$ constituting the mask pattern are cleared to "0".
(2) Each time the write address is incremented by one upon writing data to a content addressable memory cell row, the mask pattern is shifted one bit as a whole.
(3) When the write address reaches the maximum value to lap over address 0, the latches $90_0$ to $90_M$ constituting the mask pattern are cleared to "0".

After such a mask pattern is generated, information indicating whether any hit has occurred in the low address area is decoded. More specifically, AND circuits $92_0$ to $92_M$ perform AND operations between the match lines MATCH0 to MATCHM and the latches $90_0$ to $90_M$, respectively. Then, an OR circuit 94 performs an OR operation of respective signals output from the AND circuits $92_0$ to $92_M$, and a signal LOW-ADDRESS-HIT is output from the OR circuit 94. Consequently, if the signal LOW-ADDRESS-HIT is at high level, it is determined that a hit has occurred in the low address area, and if the signal LOW-ADDRESS-HIT is at low level, it is determined that no hit has occurred in the low address area.

If any hit has occurred in the low address area, information on hits in the low address area is transferred to a priority encoder 102, with any hit in the high address area being masked. More specifically, when any hit has occurred in the low address area, the signal LOW-ADDRESS-HIT at high level from the OR circuit 94 is input to one of the input terminals of each of NAND circuits $98_0$ to $98_M$.

As illustrated in FIG. 9, since each of the latches 90 in the low address area holds "1" (the latches $90_0$ to $90_2$ depicted in FIG. 9), a low level signal from each of corresponding NOT circuits 96 is input to the other input terminal of each of the corresponding NAND circuits 98. Thus, each of the corresponding NAND circuits 98 inputs a high level signal to one of the input terminals of each of corresponding AND circuits 100. As a result, each of the corresponding AND circuits 100 directly inputs the level of the corresponding match line MATCH to the priority encoder 102.

On the other hand, since each of the latches 90 in the high address area holds "0" (the latches $90_3$ to $90_M$ depicted in FIG. 9), a high level signal from each of the corresponding NOT circuits 96 is input to the other input terminal of each of the corresponding NAND circuits 98. Thus, each of the corresponding NAND circuits 98 inputs a low level signal to one of the input terminals of each of the corresponding AND circuits 100. As a result, regardless of the level of the corresponding match line MATCH, the corresponding AND circuit 100 inputs a low level signal to the priority encoder 102.

Subsequently, the priority encoder 102 selects the highest address from addresses at which the respective match lines MATCH are at high level. This highest address is output from the priority encoder 102 as the address MATCH-ADDRESS. As previously described with reference to FIG. 2, the address MATCH-ADDRESS is output from the address output circuit 60 to the controller 22 in accordance with the first implementation.

Conversely, when no hit has occurred in the low address area, information on hits in the whole area is directly transferred to the priority encoder 102. That is, when no hit has occurred in the low address area, the signal LOW-ADDRESS-HIT at low level from the OR circuit 94 is input to one of the input terminals of each of the NAND circuits $98_0$ to $98_M$.

Since each of the latches 90 in the low address area holds "1" (the latches $90_0$ to $90_2$), a low level signal from each of the corresponding NOT circuits 96 is input to the other input terminal of each of the corresponding NAND circuits 98. Thus, each of the corresponding NAND circuits 98 inputs a high level signal to one of the input terminals of each of the corresponding AND circuits 100. As a result, each of the corresponding AND circuits 100 directly inputs the level of the corresponding match line MATCH to the priority encoder 102.

On the other hand, since each of the latches 90 in the high address area holds "0" (the latches $90_3$ to $90_m$), a high level signal from each of the corresponding NOT circuits 96 is input to the other input terminal of each of the corresponding NAND circuits 98. Thus, each of the corresponding NAND circuits 98 inputs a high level signal to one of the input terminals of each of the corresponding AND circuits 100. As a result, each of the corresponding AND circuits 100 directly inputs the level of the corresponding match line MATCH to the priority encoder 102.

Subsequently, the priority encoder 102 selects the highest address from addresses at which the respective match lines MATCH are at high level. This highest address is output from the priority encoder 102 as the address MATCH-ADDRESS. As previously described with reference to FIG. 2, the address MATCH-ADDRESS is output from the address output circuit 60 to the controller 22 in accordance with the first implementation.

In sum, the previously described exemplary embodiment increases the probability of successfully selecting a position in which data has been recently written from a plurality of positions in which the data is stored. When signals MATCH indicating a plurality of addresses in the content addressable memory cell array 26 are input into the address output circuit 60, the latches 90, the AND circuits 92, and the OR circuit 94 determine whether at least one of the plurality of addresses resides in the low address area. When at least one of the plurality of addresses resides in the low address area, the latches 90, the NOT circuits 96, the NAND circuits 98, and the AND circuits 100 mask the signals MATCH from the high address area. A priority encoder 102 outputs, as an address MATCH-ADDRESS to be selected out of the plurality of addresses, the highest address out of addresses indicated by the signals MATCH input that is not masked.

Figure 10:
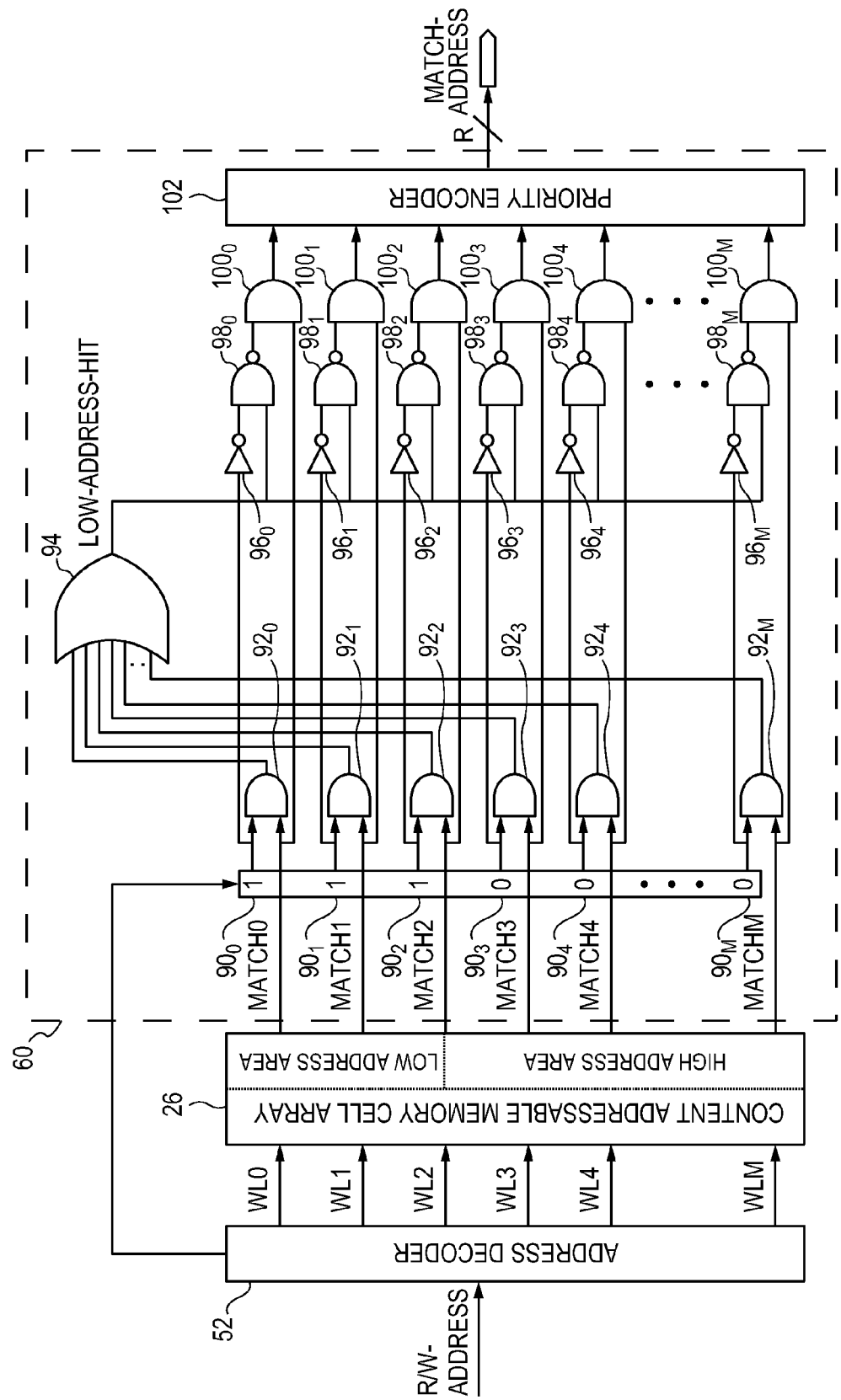
FIG. 10 is a diagram showing another exemplary configuration of the address output circuit according to an exemplary embodiment.

Alternatively, a mask pattern may be generated by decoding a write address. FIG. 10 is a diagram showing a configuration of the address output circuit 60 in accordance with another exemplary embodiment. As was the case in FIG. 9, FIG. 10 shows the relationship between the address output circuit 60 and other components of the character string search unit 20 previously discussed with reference to FIG. 2. In accordance with this configuration, the address decoder 52 generates a mask pattern corresponding to a write address one-on-one, as shown in the drawing. For example, the address decoder 52 generates a mask pattern "1000 . . . 00"

when the signal R/W-ADDRESS indicates address 0, and the address decoder 52 generates a mask pattern "1100 . . . 00" when the signal R/W-ADDRESS indicates address 1. In accordance with this circuit configuration, the mask pattern need not be reset, and thus the circuit is simple. Factors such as gate size, gate delay, and the like may be used in determining the appropriate circuit configuration to use in a given situation.

In FIGS. 9 and 10, the low address area is an exemplary specific area in a memory where data elements are written in the current cycle, and a circuit including the latches 90, the AND circuits 92, and the OR circuit 94 is an exemplary determination unit for determining whether a plurality of positions include any position in the specific area. Furthermore, a circuit including the latches 90, the NOT circuits 96, the NAND circuits 98, and the AND circuits 100 is an exemplary selection unit for selecting at least one position in the specific area from the plurality of positions or for selecting at least one position from the plurality of positions. Moreover, this circuit is an exemplary extraction unit for extracting a signal group including at least one signal out of a plurality of signals or a signal group including a plurality of signals. Furthermore, the priority encoder 102 is an exemplary output unit for outputting a signal indicating an address at which a data element is written, each of the latches 90 is an exemplary storage unit for storing a mask pattern to be used to mask signals, and the address decoder 52 is an exemplary generation unit for generating a mask pattern.

Figure 11:
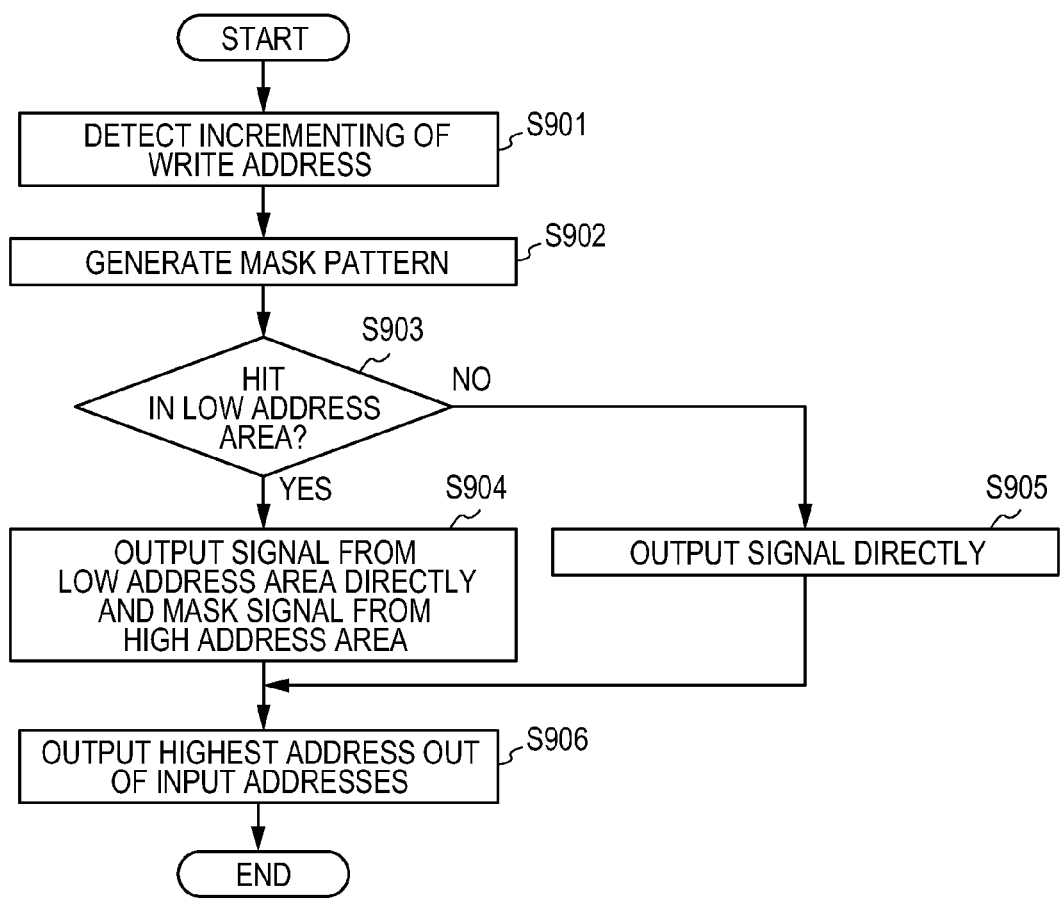
FIG. 11 is a flowchart showing an exemplary operation of the character string search unit according to an exemplary embodiment.

FIG. 11 is a flowchart showing an operation of the address output circuit 60 in accordance with an exemplary embodiment. First, the address output circuit 60 detects an incrementing of the write address (step 901). Then, the address output circuit 60 generates a mask pattern (step 902). A method for generating a mask pattern by shifting the latches 90 as a whole, as shown in FIG. 9, or a method in which the address decoder 52 generates a mask pattern on the basis of the signal R/W-ADDRESS, as shown in FIG. 10, may be considered as the method for generating a mask pattern.

Subsequently, the address output circuit 60 determines whether any hit has occurred in the low address area (step 903). Such determination can be made by performing, in the OR circuit 94, an OR operation of signals from the AND circuits $92_0$ to $92_M$, as previously described with reference to FIGS. 9 and 10. If the address output circuit 60 determines that any hit has occurred in the low address area, then in the low address area, the level of each of the corresponding match lines MATCH is directly input to the priority encoder 102, and in the high address area, regardless of the level of each of the corresponding match lines MATCH, a low level signal is input to the priority encoder 102 (i.e., masking is performed with respect to the high address area) (step 904). Then, the process proceeds to step 906.

Conversely, if the address output circuit 60 determines that no hit has occurred in the low address area, then in both the low address area and the high address area, the level of each of the match lines MATCH is input directly to the priority encoder 102 (step 905).

Subsequently, the priority encoder 102 outputs, as the address MATCH-ADDRESS, the highest address out of input addresses at which the respective match lines MATCH are at high level (step 906).

In accordance with an exemplary embodiment, data is written to the content addressable memory cell array 26 from top to bottom in address order. However, the order of writing is not limited to this order. In accordance with another exemplary embodiment, the order of writing in which data is not written in address order, but rather data is written to all addresses after one cycle is completed.

Second Implementation

A second implementation now will be described. The same reference numerals are assigned to the same components as those in the first implementation, and the description is omitted. In the second implementation, instead of the controller 22 being provided according to the first implementation, a character string compression controller 120 is provided that incorporates the character string search unit 20 and its constituent components previously described herein.

Figure 12:
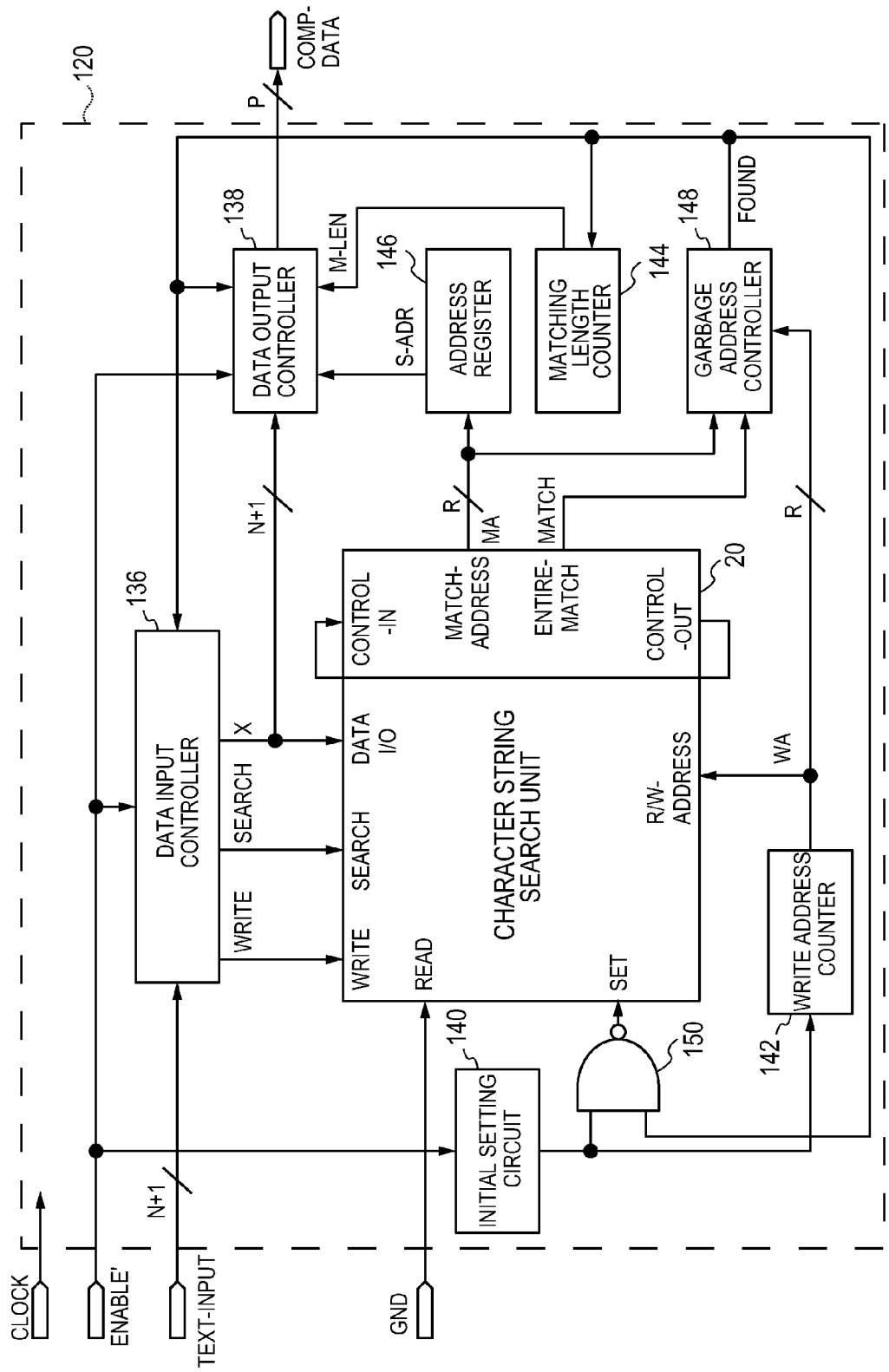
FIG. 12 is a block diagram showing an exemplary configuration of a character string compression controller according to an exemplary embodiment.

FIG. 12 is a diagram showing the character string compression controller 120 in accordance with an exemplary embodiment. The system clock CLOCK, a signal ENABLE' that is set to low level when a compression operation is performed, and character string data TEXT-INPUT (original data) to be compressed are input to the character string compression controller 120. The signal ENABLE' is supplied to a data input controller 136, a data output controller 138, and an initial setting circuit 140 in order to operate these circuits during a compression operation. Furthermore, the character string data TEXT-INPUT to be compressed is supplied to the data input controller 136.

In this case, character string data to be compressed is an exemplary data element group, and the character string compression controller 120 is an exemplary encoding unit for encoding a data element group.

The data input controller 136 is connected to the character string search unit 20 and the data output controller 138. The data input controller 136 repeats the following operations while shifting the position of character data to be fetched one character toward the end of the character string data: (1) fetching a character of character data from the beginning of the supplied character string data to be compressed in order to output the character of character data to the write buffer 56 of the character string search unit 20 and to the data output controller 138; and (2) outputting the search instruction SEARCH and the write instruction WRITE in sequence to the character string search unit 20. As a result, in response to the search instruction SEARCH, character data stored in content addressable memory cell rows of the character string search unit 20 is compared with the character data output to and held in the write buffer 56. Subsequently, in response to the write instruction WRITE, the held character data is written to the content addressable memory cell array 26.

Moreover, a write address counter 142 is connected to the initial setting circuit 140, and the initial setting circuit 140 is connected to the character string search unit 20 via a NAND circuit 150. When the signal ENABLE' is set to low level, the initial setting circuit 140 temporarily sets an output signal active (low level). As a result, the signal SET that is output from the NAND circuit 150 and that is input to the character string search unit 20 is temporarily set to high level.

The write address counter 142 is connected to the character string search unit 20 and a garbage address controller 148. The write address counter 142 holds as a count value the address of a specific content addressable memory cell row in the content addressable memory cell array 26 and outputs the count value to the character string search unit 20 and the garbage address controller 148 as an address R/W-ADDRESS. When a signal input from the initial setting circuit 140 is set to low level, the count value (address) of the write address counter 142 is reset to "0" (which represents the address of a content addressable memory cell row at the beginning of the content addressable memory cell array 26).

The count value (address) of the write address counter 142 is incremented each time data is written to the content addressable memory cell array 26.

Thus, when the character data held in the write buffer 56 is written to the content addressable memory cell array 26 in response to the aforementioned write instruction WRITE, the content addressable memory cell row to which character data is written is sequentially shifted in response to incrementing the address R/W-ADDRESS. Furthermore, in a state in which the write address counter 142 holds the address of a content addressable memory cell row connected to the word line WLM (a content addressable memory cell row at the end of the content addressable memory cell array 26), when data is written to the content addressable memory cell array 26, the count value of the write address counter 142 is reset to "0".

The garbage address controller 148 is connected to the character string search unit 20, and the signal ENTIRE-MATCH and the address MATCH-ADDRESS are input to the garbage address controller 148 from the character string search unit 20. When the write address has not gone once through all addresses, and when the signal ENTIRE-MATCH is maintained at high level as the result of a comparison operation in the character string search unit 20, the garbage address controller 148 compares the address R/W-ADDRESS input from the write address counter 142 with the address MATCH-ADDRESS. When the address MATCH-ADDRESS is equal to or more than the address R/W-ADDRESS, the garbage address controller 148 sets an output signal FOUND to low level (low level indicating invalid status), the signal FOUND indicating whether the result of the latest comparison operation is invalid. The garbage address controller 148 also sets the signal FOUND to low level when a character string compression operation is started.

A matching length counter 144 and the data output controller 138 are connected to the garbage address controller 148, and the signal FOUND is input to the matching length counter 144 and the data output controller 138. Furthermore, the garbage address controller 148 outputs the aforementioned signal FOUND to be used as an input to the NAND circuit 150 for determining the signal SET input to the character string search unit 20.

After a comparison operation is performed in the character string search unit 20, in the event that the signal FOUND input to the matching length counter 144 from the garbage address controller 148 is at high level, the count value of the matching length counter 144 is incremented. In the event that the signal FOUND is at low level, i.e., when a character string compression operation is started or when the result of a latest comparison operation is invalid, the count value of the matching length counter 144 is reset to "0". The data output controller 138 is connected to the matching length counter 144, and the matching length counter 144 outputs the count value to the data output controller 138 as matching length M-LEN.

Furthermore, an address register 146 is connected to the character string search unit 20. The address register 146 receives and holds the address MATCH-ADDRESS output from the character string search unit 20 and outputs the address MATCH-ADDRESS to the data output controller 138 as an address S-ADR.

The data output controller 138 holds the matching length M-LEN output from the matching length counter 144 and the address S-ADR output from the address register 146. When the input signal FOUND is maintained at high level even after a comparison operation is performed in the character string search unit 20, outputting of the input character data is stopped until the signal FOUND changes to low level after the following comparison operations or until the character data fetched by the data input controller 136 from the character string data to be compressed reaches the end of the character string data to be compressed.

Then, when the signal FOUND has changed to low level after the following comparison operations or when the character data fetched from the character string data to be compressed has reached the end of the character string data to be compressed, data input from the data input controller 136 while outputting of the input character data is stopped is replaced with other data (compressed) on the basis of the held address S-ADR and matching length M-LEN to be output as compressed character string data COMP-DATA. When the signal FOUND after the preceding comparison operation is performed is at low level and when the signal FOUND after the latest comparison operation is performed is also at low level, the data input from the data input controller 136 is output directly.

Figure 13:
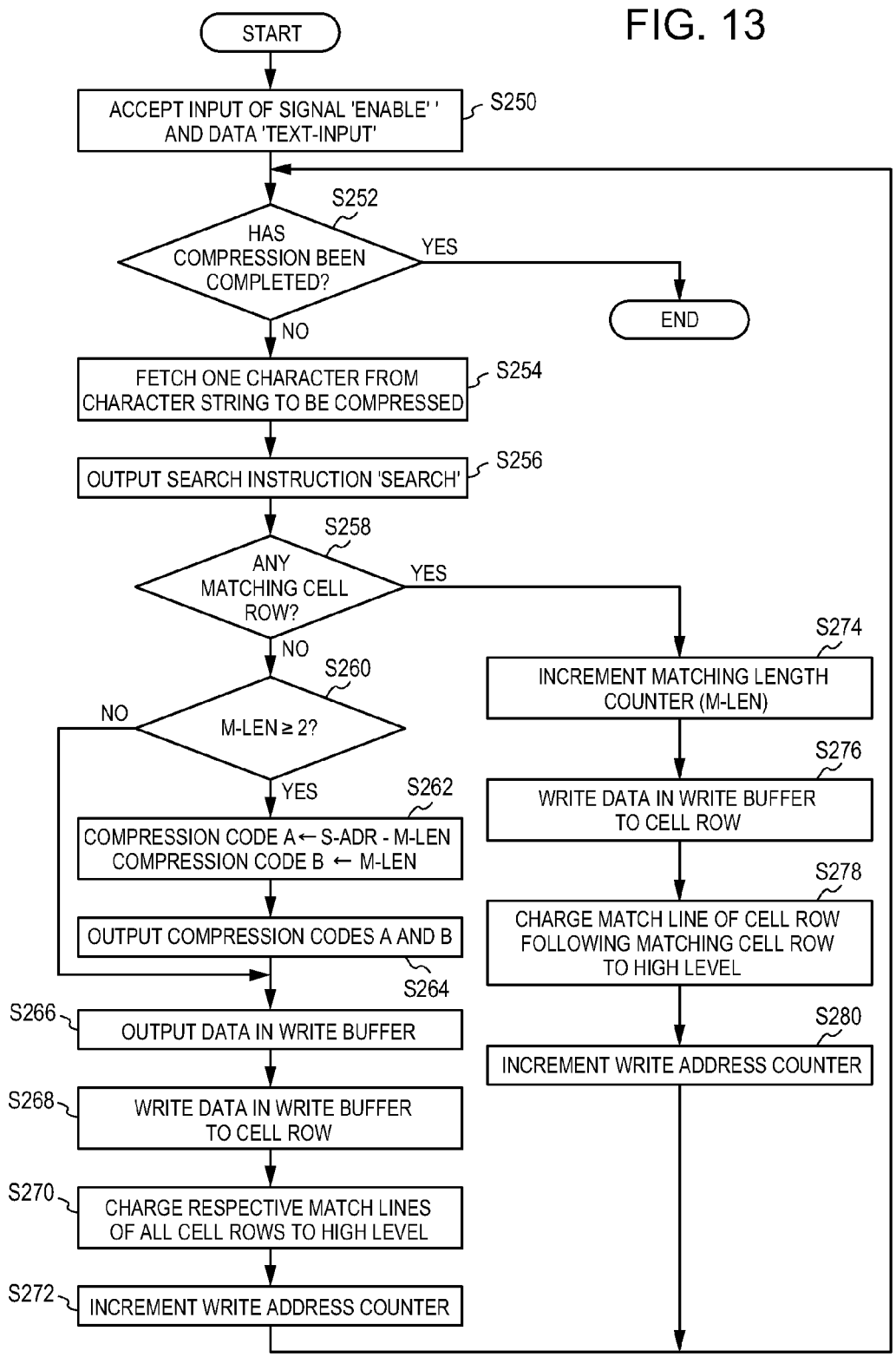
FIG. 13 is a flowchart showing an exemplary operation of the character string compression controller according to an exemplary embodiment.

The respective operations of the character string compression controller 120 and the character string search unit 20 according to an exemplary embodiment now will be described. FIG. 13 is a flowchart showing operations of these components when a compression operation is performed in accordance with an exemplary embodiment.

The character string compression controller 120 first receives input of the signal ENABLE' and the character string data TEXT-INPUT to be compressed as an instruction to start a compression operation (step 250). As a result, the character string data to be compressed is held in the data input controller 136. Moreover, the initial setting circuit 140 outputs a reset signal to the write address counter 142 and the matching length counter 144 so that the respective count values of the counters are reset to "0". Furthermore, the signal SET input to the character string search unit 20 via the NAND circuit 150 is temporarily set to high level to be input to the precharge controllers 58. When the signal SET is set to high level, the precharge controllers 58 set the respective match lines to high level in synchronization with the clock SR, as previously described herein.

Subsequently, the data input controller 136 determines whether a compression operation has been completed (step 252). If a compression operation has been completed, then the process ends. Conversely, if a compression operation has not been completed, character data corresponding to one character at the beginning of the held character string data to be compressed is fetched to be output to the write buffer 56 of the character string search unit 20 (step 254). Furthermore, the data input controller 136 outputs the search instruction SEARCH (step 256). As a result, the clock SR and the clock WT-SR are output from the timing controller 50 of the character string search unit 20, and a comparison operation is performed for each content addressable memory cell row, as previously described herein.

Then, the data output controller 138 determines whether there is any content addressable memory cell row in which the comparison result is "matching", i.e., whether the signal FOUND is at high level (step 258). If it is determined that there is no content addressable memory cell row in which the comparison result is "matching", then the process proceeds to step 260. For example, during the initial comparison operation, no character data is written to the content addressable memory cells 28 in the content addressable memory cell array 26. Thus, data stored in the content addressable memory cells 28 is undefined, and thus any scenario in which there is a content addressable memory cell row in which the comparison result is "matching" (i.e., the signal ENTIRE-MATCH is maintained at high level) is accidental. As previously described herein, when the write address has not gone once through all addresses and when the signal ENTIRE-MATCH is maintained at high level, the garbage address controller 148 compares the input address R/W-ADDRESS with the address MATCH-ADDRESS. If the address MATCH-ADDRESS is equal to or more than the address R/W-ADDRESS, it is determined that the result of the latest comparison operation is invalid, and the signal FOUND is set to low level (representing "invalid"). Thus, in this case it is determined in step 258 that there is no content addressable memory cell row in which the comparison result is "matching", and accordingly the process proceeds to step 260.

Subsequently, the data output controller 138 determines whether the count value M-LEN that is output from the matching length counter 144 is greater than or equal to "2", i.e., whether the signal FOUND indicating "valid" has been output in the past two comparison operations (step 260). If it is determined that the counter value M-LEN is not greater than or equal to "2" (i.e., the counter value M-LEN is less than "2"), then the data output controller 138 outputs the character data input from the data input controller 136 (step 266). For example, during the initial comparison operation, since the held matching length M-LEN is "0", the data output controller 138 determines, in step 260, that the matching length M-LEN is not greater than or equal to "2", and consequently in step 266 the data output controller 138 outputs the character data input from the data input controller 136, i.e., the character data held in the write buffer 56, as the compressed data COMP-DATA.

Then, the data input controller 136 outputs the write instruction WRITE, and accordingly the character string search unit 20 writes the character data held in the write buffer 56 to a content addressable memory cell row of the content addressable memory cell array 26 (step 268). The content addressable memory cell row to which the character data is written is the row corresponding to the address held in the write address counter 142.

Subsequently, the low level signal FOUND is input to the character string search unit 20 via the NAND circuit 150 as the high level signal SET, and accordingly the precharge controllers 58 charge the respective match lines to high level (step 270). Then, the count value of the write address counter 142 is incremented (step 272). Subsequently, the process returns to step 252.

In this manner, while the determination results in steps 258 and 260 are "No", the character data held in the write buffer 56 is output from the data output controller 138 as the compressed character string data COMP-DATA and is stored in the content addressable memory cell array 26. Furthermore, as the count value in the write address counter 142 is incremented, the address of a content addressable memory cell row to which the character data is written is sequentially shifted each time a comparison operation is performed.

Conversely, in step 258, when the character data held in the write buffer 56 matches character data stored in any of the content addressable memory cell rows, the signal FOUND output from the garbage address controller 148 is set to high level (indicating "valid"), and consequently the data output controller 138 determines that there is a content addressable memory cell row in which the comparison result is "matching". In this case, data is not output, and the count value is of the matching length counter 144 is incremented by inputting the signal FOUND indicating "valid" to the matching length counter 144 (step 274). This count value is held in the data output controller 138 as the matching length M-LEN.

Furthermore, the character string search unit 20 writes the character data to the content addressable memory cell array 26 in the same way as in step 268 (step 276). Then, the match line of a content addressable memory cell row following a content addressable memory cell row that has a match line maintained at high level after a comparison operation is set to high level, while the respective match lines of the other content addressable memory cell rows are set to low level (step 278). Then, the count value of the write address counter 142 is incremented (step 280). Subsequently, the process returns to step 252.

A case in which a positive determination result occurs in step 258 more than once is a case in which a character string including character data input continuously to the write buffer 56 is also stored in the content addressable memory cell array 26. That is, a case in which a positive determination result occurs in step 258 more than once is a case in which a repeating character string including two or more characters is found in a character string to be compressed. After the process from steps 274 to 280 is repeated more than once, if a negative determination result occurs in step 258, i.e., if there is no content addressable memory cell row in which the comparison result is "matching" in the latest comparison operation, then the process proceeds to step 260. If in step 260 there are content addressable memory cell rows in which the respective comparison results are "matching" in the past two comparison operations (i.e., M-LEN is greater than or equal to "2"), then a positive determination result occurs in step 260, and consequently the process proceeds to step 262.

In such case, the data output controller 138 determines a compression code for compressing the repeating character string found in the aforementioned process (step 262). More specifically, in step 262 the data output controller 138 determines a compression code including a compression code A, which represents a pointer indicating the position of the same character string as the repeating character string that already has been output, and a compression code B, which represents the length of the repeating character string. The difference between the address S-ADR and the matching length M-LEN held in the data output controller 138 (S-ADR-M-LEN) is set as the compression code A, and the matching length M-LEN is set as the compression code B. Subsequently, the data output controller 138 outputs the compression code comprising the compression code A and the compression code B (step 264).

In sum, the character string data TEXT-INPUT to be compressed is converted to the compressed character string data COMP-DATA to be output via the aforementioned process. As a result of the process, the length of the compressed character string data COMP-DATA that is output from the data output controller 138 is shorter than the length of the character string data TEXT-INPUT to be compressed that is input to the character string compression controller 120. When the compression code is output, in order to distinguish the compression code from the character data at the time of decompressing the compressed character string, the data output controller 138 inserts a code representing a separator between the character data and the compression code.

Exemplary embodiments have been described. In accordance with the exemplary embodiments, in a case where character data at the current address in the content addressable memory cell array 26 is found at a plurality of addresses, when at least some of the plurality of addresses reside in the low address area, the highest address in the low address area is selected, and when none of the plurality of addresses resides in the low address area, the highest address out of all of the plurality of addresses is selected. Accordingly, character data closest to the character data at the current address in the order of writing can be selected.

Moreover, the compression rate can be improved from that in the known art by compressing a character string starting from the current address, using the position of the selected character data and the length of a matching portion.

While the various embodiments have been described with reference to exemplary embodiments, the technical scope of the various embodiments is not limited to the above described exemplary embodiments. It will be apparent to those skilled in the art that various modifications can be made in the exemplary embodiments and alternative embodiments can be adopted without departing from the spirit and scope of the various embodiments.

The invention claimed is:

1. An apparatus for selecting a specific position from a plurality of positions in a memory to which data elements are cyclically written, a specific data element being stored in the plurality of positions, the apparatus comprising:
   a determination unit for determining whether the plurality of positions include any position in a specific area of the memory to which data elements are written in a single cycle, wherein the specific area is composed of positions at which data elements are writable before a data element is written at a current position in the single cycle; and
   a selection unit for selecting at least one position in the specific area out of the plurality of positions as the specific position if the determination unit determines that the plurality of positions include any position in the specific area, and for selecting at least one position out of the plurality of positions as the specific position if the determination unit determines that the plurality of positions do not include any position in the specific area.

2. The apparatus according to claim 1, further comprising:
   a signal generation unit for generating a plurality of signals indicating the plurality of positions,
   wherein, if the determination unit determines that the plurality of positions include any position in the specific area, the selection unit selects at least one position in the specific area on the basis of at least one signal obtained by masking each signal out of the plurality of signals that indicates a position in an area other than the specific area.

3. The apparatus according to claim 2, further comprising:
   a storage unit for storing a mask pattern to be used by the selection unit to mask a signal,
   wherein, if the specific area is expanded, the mask pattern is modified so as not to mask each signal indicating a position in an area of the memory that is newly included in the specific area.

4. The apparatus according to claim 2, further comprising:
   a storage unit for storing a mask pattern to be used by the selection unit to mask a signal; and
   a generation unit for generating the mask pattern on the basis of a signal indicating a boundary between the specific area and an area other than the specific area.

5. The apparatus according to claim 1, further comprising:
   a signal generation unit for generating a plurality of signals indicating the plurality of positions,
   wherein the determination unit determines whether the plurality of positions include any position in the specific area by performing an OR operation involving at least one signal obtained by masking each signal out of the plurality of signals that indicates a position in an area other than the specific area.

6. The apparatus according to claim 1, wherein the determination unit is a circuit comprising a plurality of latches, a plurality of AND circuits, and an OR circuit.

7. The apparatus according to claim 1, wherein the selection unit is a circuit comprising a plurality of latches, a plurality of NOT circuits, a plurality of NAND circuits, and a plurality of AND circuits.

8. An apparatus for selecting a specific address from a plurality of addresses in a memory to which data elements are cyclically written in address order, a specific data element being stored at the plurality of addresses, the apparatus comprising:
   a signal generation unit for generating a plurality of signals indicating the plurality of addresses;
   a determination unit for determining whether any of the plurality of signals indicates an address at which a data element is written before a data element is written at a current address in a single cycle; and
   an extraction unit for extracting a signal group out of the plurality of signals that includes at least one signal obtained by masking each signal indicating an address at which a data element is written after a data element is written at the current address in the single cycle if the determination unit determines that any of the plurality of signals indicates an address at which a data element is written before a data element is written at the current address, and for extracting a signal group including the plurality of signals if the determination unit determines that none of the plurality of signals indicates an address at which a data element is written before a data element is written at the current address.

9. The apparatus according to claim 8, further comprising an output unit for outputting a signal indicating the specific address, the signal being selected out of signals constituting the signal group extracted by the extraction unit.

10. The apparatus according to claim 9, wherein the specific address is the highest address indicated by the signals constituting the signal group extracted by the extraction unit.

11. The apparatus according to claim 8, wherein the extraction unit is a circuit comprising a plurality of latches, a plurality of NOT circuits, a plurality of NAND circuits, and a plurality of AND circuits.

12. An apparatus for encoding a specific data element group with respect to a plurality of data elements stored in a memory to which data elements are cyclically written, the apparatus comprising:
   a detection unit for detecting, for each data element constituting the specific data element group, a plurality of positions in the memory, the data element being stored in the plurality of positions;
   a determination unit for determining, for each data element constituting the specific data element group, whether the plurality of positions detected by the detection unit include any position in a specific area of the memory to which data elements are written in a single cycle, wherein the specific area is composed of positions at which data elements are writable before a data element is written at a current position in the single cycle; and
   a selection unit for selecting, for each data element constituting the specific data element group, a position in the specific area out of the plurality of positions if the determination unit determines that the plurality of positions include any position in the specific area, and for selecting, for each data element constituting the specific data element group, a position out of the plurality of positions if the determination unit determines that the plurality of positions do not include any position in the specific area.

13. The apparatus according to claim 12, further comprising an encoding unit for encoding the specific data element group using the position selected by the selection unit regarding a specific data element constituting the specific data element group and a number of times the position is continuously selected by the selection unit, if the position is continuously selected by the selection unit.

14. The apparatus according to claim 12, wherein the determination unit is a circuit comprising a plurality of latches, a plurality of AND circuits, and an OR circuit.

15. The apparatus according to claim 12, wherein the selection unit is a circuit comprising a plurality of latches, a plurality of NOT circuits, a plurality of NAND circuits, and a plurality of AND circuits.

16. A method for selecting a specific position from a plurality of positions in a memory to which data elements are cyclically written, a specific data element being stored in the plurality of positions, the method comprising:
   determining whether the plurality of positions include any position in a specific area of the memory to which data elements are written in a single cycle, wherein the specific area is composed of positions at which data elements are writable before a data element is written at a current position in the single cycle; and
   selecting at least one position in the specific area out of the plurality of positions as the specific position if it is determined that the plurality of positions include any position in the specific area, and selecting at least one position out of the plurality of positions as the specific position if it is determined that the plurality of positions do not include any position in the specific area.

17. The method according to claim 16, further comprising:
   generating a plurality of signals indicating the plurality of positions; and
   selecting at least one position in the specific area on the basis of at least one signal obtained by masking each signal out of the plurality of signals that indicates a position in an area other than the specific area, if it is determined that the plurality of positions include any position in the specific area.

18. The method according to claim 17, further comprising:
   storing a mask pattern to be used to mask a signal; and
   on condition that the specific area is expanded, modifying the mask pattern so as not to mask each signal indicating a position in an area of the memory that is newly included in the specific area.

19. The method according to claim 17, further comprising:
   storing a mask pattern to be used by the selection unit to mask a signal; and
   generating the mask pattern on the basis of a signal indicating a boundary between the specific area and an area other than the specific area.

20. The method according to claim 16, further comprising:
   generating a plurality of signals indicating the plurality of positions; and
   determining whether the plurality of positions include any position in the specific area by performing an OR operation involving at least one signal obtained by masking each signal out of the plurality of signals that indicates a position in an area other than the specific area.

* * * * *